(12) United States Patent
Ripley

(10) Patent No.: US 10,033,385 B2
(45) Date of Patent: *Jul. 24, 2018

(54) DUAL MODE POWER AMPLIFIER CONTROL INTERFACE WITH A MULTI-MODE GENERAL PURPOSE INPUT/OUTPUT INTERFACE

(71) Applicant: SKYWORKS SOLUTIONS, INC., Woburn, MA (US)

(72) Inventor: David Steven Ripley, Marion, IA (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/388,138

(22) Filed: Dec. 22, 2016

(65) Prior Publication Data

US 2017/0207786 A1    Jul. 20, 2017

Related U.S. Application Data

(63) Continuation of application No. 14/937,419, filed on Nov. 10, 2015, now Pat. No. 9,543,919, which is a
(Continued)

(51) Int. Cl.
*H03K 19/173* (2006.01)
*H03K 19/0185* (2006.01)
(Continued)

(52) U.S. Cl.
CPC ... *H03K 19/018521* (2013.01); *H03F 1/0222* (2013.01); *H03F 3/195* (2013.01);
(Continued)

(58) Field of Classification Search
CPC ............ H03K 19/018521; H03K 17/22; H03F 1/0222; H03F 3/195; H03F 3/213; H03F 2200/451; H04B 1/40; H04B 2001/0408
(Continued)

(56) References Cited

U.S. PATENT DOCUMENTS 6,108,726 A    8/2000 Runaldue et al.
6,601,124 B1    7/2003 Blair
(Continued)

FOREIGN PATENT DOCUMENTS

CN    1918785 A    2/2007
TW    200505176 A1    2/2005
(Continued)

OTHER PUBLICATIONS

International Search Report and Written Opinion for PCT/US2012/061499, dated Mar. 29, 2013; in 12 pages.
(Continued)

*Primary Examiner* — Don Le
(74) *Attorney, Agent, or Firm* — Knobbe, Martens, Olson & Bear, LLP

(57) ABSTRACT

In accordance with some embodiments, the present disclosure relates to a dual mode control interface that can be used to provide both a radio frequency front end (RFFE) serial interface and a two-mode general purpose input/output (GPIO) interface within a single digital control interface die. In certain embodiments, the dual mode control interface, or digital control interface, can communicate with a power amplifier. Further, the dual mode control interface can be used to set the mode of the power amplifier.

19 Claims, 9 Drawing Sheets

Related U.S. Application Data continuation of application No. 14/300,998, filed on Jun. 10, 2014, now Pat. No. 9,214,979, which is a continuation of application No. 13/658,488, filed on Oct. 23, 2012, now Pat. No. 8,791,719.

(60) Provisional application No. 61/550,856, filed on Oct. 24, 2011, provisional application No. 61/589,753, filed on Jan. 23, 2012.

(51) Int. Cl.
| | |
|---|---|
| H03K 17/22 | (2006.01) |
| H03F 3/195 | (2006.01) |
| H03F 3/213 | (2006.01) |
| H03F 1/02 | (2006.01) |
| H04B 1/40 | (2015.01) |
| H04B 1/04 | (2006.01) |

(52) U.S. Cl.
CPC ............ *H03F 3/213* (2013.01); *H03K 17/22* (2013.01); *H04B 1/40* (2013.01); *H03F 2200/451* (2013.01); *H04B 2001/0408* (2013.01)

(58) Field of Classification Search
USPC ..................................... 315/80, 38
See application file for complete search history.

(56) References Cited

U.S. PATENT DOCUMENTS

| | | |
|---|---|---|
| 7,974,306 B2 | 7/2011 | Huang et al. |
| 8,521,101 B1 | 8/2013 | Kadam et al. |
| 8,719,459 B2 | 5/2014 | Ripley |
| 8,791,719 B2 | 7/2014 | Ripley |
| 2005/0017702 A1 | 1/2005 | Kernahan et al. |
| 2005/0160337 A1* | 7/2005 | Whetsel ........... G01R 31/31705 714/726 |
| 2005/0270052 A1 | 12/2005 | Chase |
| 2006/0218323 A1 | 9/2006 | Chen et al. |
| 2007/0064725 A1 | 3/2007 | Minami et al. |
| 2007/0124621 A1* | 5/2007 | Kim ....................... G06F 1/3203 713/323 |
| 2007/0220499 A1* | 9/2007 | Bannatyne ........... H01R 13/665 717/140 |
| 2007/0234027 A1 | 10/2007 | Heo et al. |
| 2008/0250187 A1* | 10/2008 | Nishimoto ............ G06F 9/4403 710/313 |
| 2008/0307240 A1 | 12/2008 | Dahan et al. |
| 2009/0077279 A1 | 3/2009 | Golbus |
| 2009/0111524 A1* | 4/2009 | Basaralu ............... G06F 1/3209 455/559 |
| 2009/0137318 A1 | 5/2009 | Russo et al. |
| 2010/0023654 A1 | 1/2010 | Ramsdale |
| 2010/0231267 A1 | 9/2010 | Scott et al. |
| 2012/0233374 A1 | 9/2012 | Whitefield et al. |
| 2012/0239845 A1* | 9/2012 | Dhandapani .......... G06F 3/0604 710/300 |
| 2014/0002188 A1 | 1/2014 | Chen et al. |
| 2014/0349589 A1 | 11/2014 | Ripley |
| 2016/0134251 A1 | 5/2016 | Ripley |

FOREIGN PATENT DOCUMENTS

| | | |
|---|---|---|
| TW | I545889 | 8/2016 |
| WO | WO 98-11696 A1 | 4/1998 |
| WO | WO 2005-064788 A1 | 7/2005 |

OTHER PUBLICATIONS

Search Report dated Mar. 28, 2016 in corresponding Taiwanese Application No. 101139330, 2 pgs.
Office Action dated Oct. 12, 2016 in corresponding Taiwanese Application No. 105127719, 3 pgs.
Office Action dated Mar. 3, 2016 in corresponding Chinese Application No. 201280063914.1, 5 pgs.
Search Report dated Jul. 25, 2016 in corresponding Taiwanese Application No. 101139338, 2 pgs.
Piccolo Microcontrollers Datasheet, Texas Instruments Incorporated, 2010, 173 pages.

\* cited by examiner

DUAL MODE POWER AMPLIFIER CONTROL INTERFACE WITH A MULTI-MODE GENERAL PURPOSE INPUT/OUTPUT INTERFACE

RELATED APPLICATIONS

This disclosure claims priority to U.S. application Ser. No. 14/937,419, filed Nov. 10, 2015 and titled "DUAL MODE POWER AMPLIFIER CONTROL INTERFACE WITH A MULTI-MODE GENERAL PURPOSE INPUT/ OUTPUT INTERFACE," U.S. application Ser. No. 14/300, 998, filed Jun. 10, 2014 and titled "DUAL MODE POWER AMPLIFIER CONTROL INTERFACE WITH A MULTI-MODE GENERAL PURPOSE INPUT/OUTPUT INTERFACE," which claims priority to U.S. application Ser. No. 13/658,488, filed Oct. 23, 2012 and titled "DUAL MODE POWER AMPLIFIER CONTROL INTERFACE WITH A TWO-MODE GENERAL PURPOSE INPUT/OUTPUT INTERFACE," which claims priority to U.S. Provisional Application No. 61/550,856, filed Oct. 24, 2011 and titled "DUAL MODE POWER AMPLIFIER CONTROL INTERFACE", and to U.S. Provisional Application No. 61/589, 753, filed Jan. 23, 2012 and titled "DUAL MODE POWER AMPLIFIER CONTROL INTERFACE." The disclosures of each of the above applications are hereby expressly incorporated by reference herein in their entirety. Further, this disclosure relates to U.S. application Ser. No. 13/658,522 filed on Oct. 23, 2012 and titled "DUAL MODE POWER AMPLIFIER CONTROL INTERFACE WITH A THREE-MODE GENERAL PURPOSE INPUT/OUTPUT INTERFACE," the disclosure of which is expressly incorporated by reference herein in its entirety.

TECHNICAL FIELD

The present disclosure relates generally to power amplifiers. More specifically, the present disclosure relates to a dual mode digital control interface for power amplifiers.

BACKGROUND

A number of electronic devices, including wireless devices, may have one or more components that are controlled or set by a front-end component. For example, a power amplifier may be set or configured by a power amplifier controller. In some cases, the power amplifier controller may itself be controlled or configured by another interface component based on the state of the device.

Often, various components within a device will be created by different organizations. To facilitate interoperability between components, which may be designed by different organizations, standards are often adopted for different types of devices and components. As technology advances, standards may change or new standards may be adopted. In some cases, the newer standards are not compatible with the older standards.

SUMMARY

In accordance with some embodiments, the present disclosure relates to a dual mode control interface that can be used to provide both a radio frequency front end (RFFE) serial interface and a general purpose input/output (GPIO) interface within a single digital control interface die. In certain embodiments, the dual mode control interface, or digital control interface, can communicate with a power amplifier. Further, the dual mode control interface can be used to set the mode of the power amplifier.

In accordance with certain embodiments, the dual mode control interface includes a RFFE core configured to provide a RFFE serial interface. Further, the dual mode control interface includes a voltage input/output (VIO) pin configured to receive a VIO signal. This VIO signal determines whether an operating mode of the RFFE core is set to one of an active state and an inactive state. When the RFFE core is set to the inactive state, the dual mode control interface is configured to provide a general purpose input/output (GPIO) interface In addition, the dual mode control interface includes a combinational logic block configured to provide an enable signal and a mode signal to an enable level shifter and a mode level shifter, respectively. Moreover, the dual mode control interface includes a power on reset configured to select the enable signal and the mode signal to provide to the enable level shifter and the mode level shifter, respectively, based on the VIO signal.

For some implementations, the dual mode interface includes a clock/mode pin configured to provide a clock signal to the RFFE core when the RFFE core is set to an active state and a mode signal to the combinational logic block when the RFFE core is set to an inactive state. In addition, the dual mode interface includes a data/enable pin configured to provide a data signal to the RFFE core when the RFFE core is set to an active state and an enable signal to the combinational logic block when the RFFE core is set to an inactive state.

In some variations, the data/enable pin is further configured to provide an address signal to the RFFE core, the address signal associated with a register of the RFFE core.

In some embodiments, the dual mode interface includes a plurality of level shifters. Each level shifter of the plurality of level shifters may be configured to receive a register signal from the RFFE core. The register signal can be associated with a value stored in one of a plurality of registers associated with the RFFE core.

BRIEF DESCRIPTION OF THE DRAWINGS

Throughout the drawings, reference numbers are re-used to indicate correspondence between referenced elements. The drawings are provided to illustrate embodiments of the inventive subject matter described herein and not to limit the scope thereof.

DETAILED DESCRIPTION

Introduction

Figure 1:
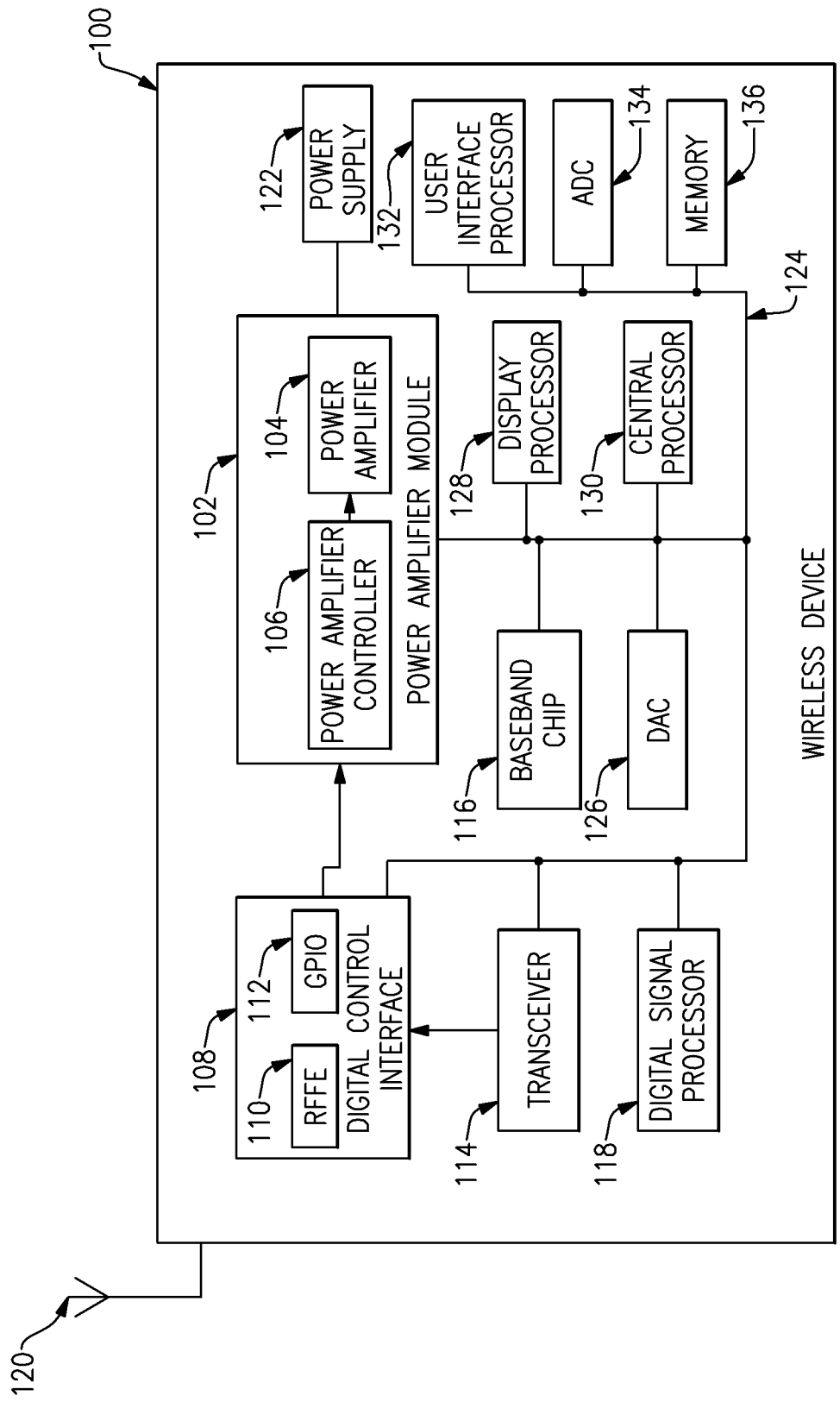
FIG. 1 illustrates an embodiment of a wireless device in accordance with aspects of the present disclosure.

When a new standard is introduced, or an existing standard is modified, it is often necessary to introduce new components or modify existing components to take advantage of the new or updated standards. For example, the adoption of the MIPI® RF Front End (RFFE) standard serial interface for supporting multiple configuration modes within a module, such as a power amplifier module, may mean that device manufacturers who wish to support the new standard may need to use a new front end component that supports the RFFE standard. Manufacturers of the front end components who have customers using the RFFE standard and customers using a different standard, such as the General Purpose Input/Output (GPIO) interface must manufacture two separate components. This can be costly because, for example, more time and human resources must be expended to produce both types of front end devices.

Further, device manufacturers who wish to support both standards may often be required to redesign their products to fit two or more components to support the standards. Not only may this require more physical space, but it may also result in greater power consumption because, for example, the multiple interface components may each consume power.

Advantageously, embodiments of the present disclosure provide a system and method for implementing multiple standards in a single die without increasing the size of the die, or the number of pins required to support the front end interfaces. Further, in some embodiments, power consumption is not increased compared to devices that use components that implement a single interface standard. Moreover, embodiments of the present disclosure provide a single interface component, or die, to support the RFFE serial interface, the GPIO interface, or both interfaces without any modifications to existing devices. In certain implementations, the size and the pin count of single component may be kept the same as a die that implements only one of the RFFE interface and the GPIO interface.

In certain embodiments, the interface component, or digital control interface, includes a RFFE core that implements the functionality of the MIPI® RFFE serial interface. This RFFE core can be configured to receive power from a Voltage Input/Output (VIO) pin. In a number of implementations, the RFFE core can cease receiving power when not in use. When the RFFE core is not powered, the digital control interface can be configured to use the pins that provide signals to the RFFE core as a GPIO interface. By using combinational logic, the digital control interface can control whether signals associated with the use of the RFFE serial interface or the GPIO interface are provided to, for example, a power amplifier. Advantageously, in certain embodiments, by merging the RFFE serial interface and the GPIO interface on a single die, it is possible for seamless adoption of the RFFE serial standard without alienating any manufacturers that are still using the GPIO interface. More details regarding combining the RFFE serial standard and the GPIO interface are described herein.

Example Electronic Device

FIG. 1 illustrates an embodiment of a wireless device 100 in accordance with aspects of the present disclosure. Applications of the present disclosure are not limited to wireless devices and can be applied to any type of electronic device, with or without a power amplifier. For example, embodiments can be applied to wired devices, weather sensing devices, RADAR, SONAR, microwave ovens, and any other device that might include a power amplifier. Further, embodiments of the present disclosure can be applied to devices that may include one or more components controlled via a front end interface. For example, embodiments of the present disclosure can be applied to Switch Mode Power Supply (SMPS) devices, which can be used for power amplifier supply regulation, Antenna Switch Modules (ASM), and antenna load tuning modules, to name a few. Although the present disclosure is not limited to wireless devices or to controlling power amplifiers, to simplify discussion, a number of embodiments will be described with respect to the wireless device 100 and a power amplifier module 102.

The wireless device 100 can include a power amplifier module 102. The power amplifier module 102 can generally include any component or device that includes a power amplifier 104 and a power amplifier controller 106 for controlling the power amplifier 104. Although not limited as such, controlling the power amplifier 104 generally refers to setting, modifying, or adjusting the amount of power amplification provided by the power amplifier 104. In some implementations, the power amplifier 104 may include the power amplifier controller 106. Further, the power amplifier module 102 may be a single component that includes the functionality of the power amplifier controller 106 and the power amplifier 104. In other implementations, the wireless device 100 may include the power amplifier 104 and the power amplifier controller 106 as separate and distinct components.

Further, the wireless device 100 can include a digital control interface 108. In some embodiments, the power amplifier module 102 includes the digital control interface 108. Generally, the digital control interface 108 can include any type of control interface that can support multiple types of front end interfaces. For example, the illustrated digital control interface 108 can support both a MIPI® Radio Frequency (RF) Front End (RFFE) serial interface 110 and a General Purpose Input/Output (GPIO) interface 112. In a number of embodiments, the digital control interface 108 can support multiple types of front end interfaces such that the interfaces can coexist on the same component die without requiring circuit design changes or bonding changes. Further, in some embodiments, the digital control interface 108 can support multiple front end interfaces without increasing the number of interface pins or connecting points exposed for use by the wireless device 100. Advantageously, in a number of embodiments, the digital control interface 108 can be used with devices that support different interface standards without modifying the digital control interface 108. For example, the illustrated digital control interface 108 of FIG. 1, can be used with devices that support MIPI® RFFE, GPIO, or a combination of the two without modifying the digital control interface 108.

In certain implementations, the digital control interface 108 can serve as an intermediary or a manager between the power amplifier module 102 and a signal source that determines or sets the mode of operation of the power amplifier module 102, the power amplifier controller 106, the power amplifier 104, or any other component that can be controlled by the digital control interface 108. The signal source can include any component that is configured to provide signals to the digital control interface 108 that can cause the digital control interface 108 to determine or set the mode of operation of, for example, the power amplifier module 102.

For instance, as illustrated in FIG. 1, the signal source can be a transceiver 114. Alternatively, or in addition, the signal source can include a baseband chip 116, a digital signal processor (DSP) 118, or any other component that can provide one or more signals to the digital control interface 108 to cause the digital control interface 108 to set the mode of operation of the power amplifier module 102 or the power amplifier 104.

In one example of a scenario of setting the mode of the power amplifier 104, the transceiver receives a signal from, for example, the antenna 120 or the DSP 118. In response to receiving the signal, the transceiver 114 can provide one or more signals to the digital control interface 108 associated with setting the mode of operation of the power amplifier 104. The digital control interface 108 can determine, based on the received signals from the transceiver 114, whether the received signals are associated with a RFFE serial interface 110 or a GPIO interface 112. The digital control interface 108 can then process the received signals using the identified interface (e.g. the RFFE serial interface 110, the GPIO interface 112, or any other interface the digital control interface 108 can include). Then, based on the outcome of processing the received signals, the digital control interface 108 can provide mode setting signals to the power amplifier control 106, which can set the mode of the power amplifier 104 based on the mode setting signals.

Generally, the mode settings of the power amplifier 104 correspond to the rate or quantity of power amplification of a signal, which is then provided to components of a device (e.g. the wireless device 100). This signal can be provided to power the components or for processing by the components of the wireless device 100. The power amplifier module can receive power from a power supply 122. The power amplifier module 102 can then distribute the power to a number of components included in the wireless device 100 as illustrated by the power distribution bus 124.

The wireless device 100 can include a number of additional components. At least some of these additional components may receive power via the power distribution bus 124. Further, at least some of the additional components may communicate with the digital control interface 108 and may cause the digital control interface 108 to modify the settings of the power amplifier module 102. For example, the wireless device 100 can include a digital to analog convertor (DAC) 126, a display processor 128, a central processor 130, a user interface processor 132, an analog to digital convertor 134, and memory 136.

Further, the components of the wireless device 100 illustrated in FIG. 1 are provided as examples. The wireless device 100 may include other components. For example, the wireless device 100 may include an audio processor, a gyroscope, or an accelerometer. Moreover, the various illustrated components may be combined into fewer components, or separated into additional components. For example, the DAC 126 and the ADC 134 can be combined into a single components, and the based band chip 116 can be combined with the transceiver 114. As another example, the transceiver 114 can be split into a separate receiver and transmitter.

Example of a Digital Control Interface

Figure 2:
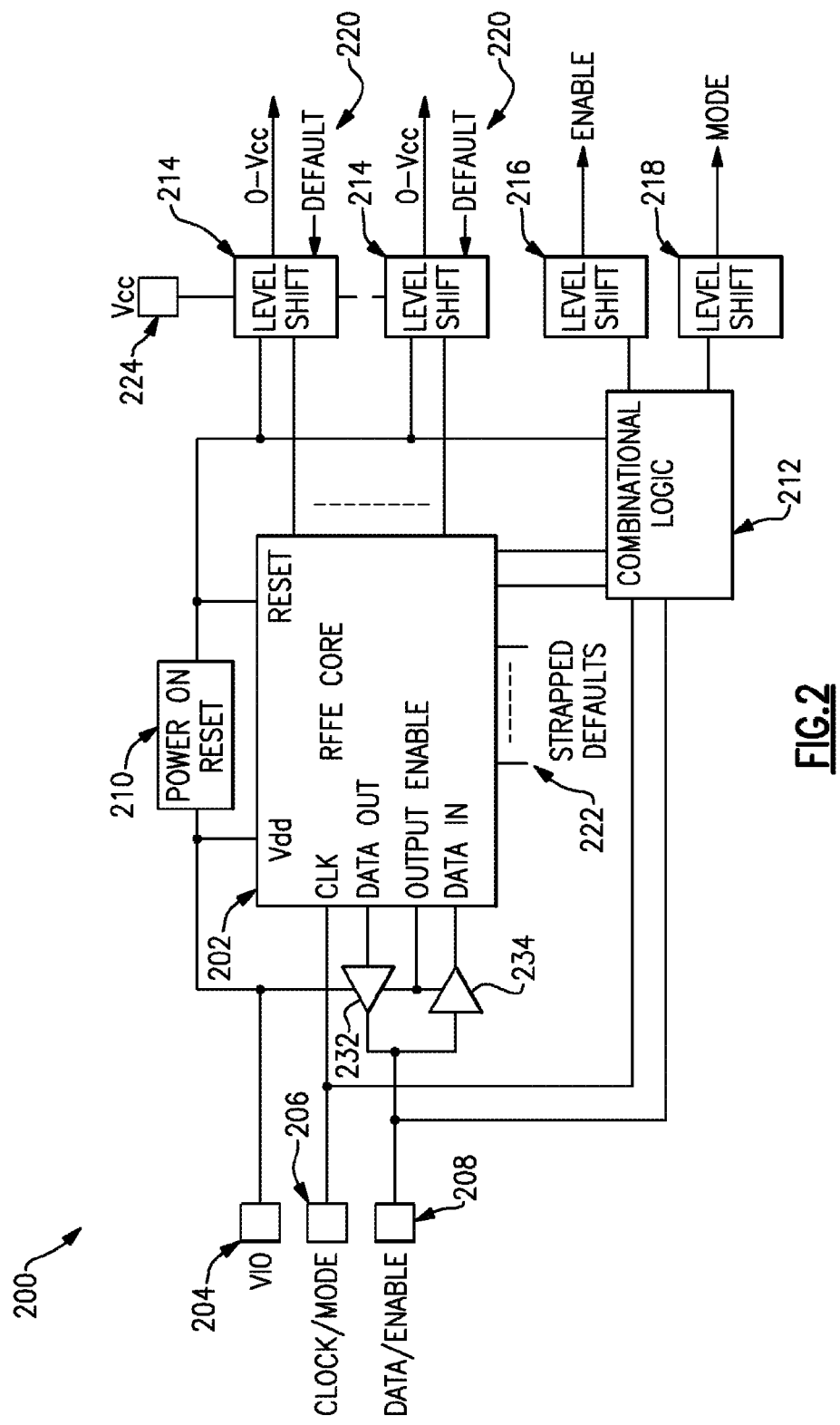
FIG. 2 illustrates an embodiment of a digital control interface in accordance with aspects of the present disclosure.

FIG. 2 illustrates an embodiment of a digital control interface 200 in accordance with aspects of the present disclosure. The digital control interface 200 includes both a RFFE serial interface and a GPIO interface. Advantageously, in certain embodiments, the digital control interface 200 can be implemented in the same size package with the same number of pins as a control interface that includes one of a RFFE serial interface and a GPIO interface. The ability to combine multiple interface types within a single chip without expanding the size of the chip is particularly advantageous for applications that use or require small packages, such as applications that may require 3 mm×3 mm modules.

The digital control interface 200 includes an RFFE core 202 that is configured to provide the functionality of a MIPI® RFFE serial interface. Further, the digital control interface 200 includes a number of input pins: a VIO pin 204, a clock/mode pin 206, and a data/enable pin 208.

The VIO pin 204 is configured to receive a signal indicating whether the digital control interface 200 should operate as a RFFE serial interface, or a GPIO interface. In the illustrated embodiment, the digital control interface 200 operates as a RFFE serial interface when the VIO pin 204 receives a logic high signal and operates as a GPIO interface when the VIO pin 204 receives a logic low signal. However, in some implementations, the digital control interface 200 can be configured to operate as a RFFE serial interface when the VIO pin 204 receives a logic low signal and as a GPIO interface when the VIO pin 204 receives a logic high signal. The logic low signal can be associated with any value defined to be low, such as 0 volts, −5 volts, or otherwise. Similarly, the logic high signal can be associated with any value defined to be high, such as 0 volts, +5 volts, or otherwise. In some implementations, the logic low signal may be associated with connecting the VIO pin 204 to ground. Similarly, in some cases, the logic high signal may be associated with connecting the VIO pin 204 to a voltage source.

In addition to setting the mode of operation for the digital control interface 200, the VIO pin 204 can also provide power from a power source, such as the power supply 122, to the RFFE core 202. Thus, in some embodiments, when the VIO pin 204 is set to logic low, or is grounded, the RFFE core 202 is not powered and the digital control interface 200 is configured to function as a GPIO interface. On the other hand, in some embodiments, when the VIO pin 204 is set to logic high, or is connected, directly or indirectly, to a power source, the RFFE core 202 is provided with power and the digital control interface 200 is configured to function as a RFFE serial interface.

Further, the digital control interface 200 includes a power on reset 210, which may be implemented in hardware, software, or a combination of the two. The power on reset 210 is configured to facilitate resetting the RFFE core 202. In some embodiments, the power on reset 210 can serve as an inverted delay function. The inverted delay function is configured to provide sufficient time for one or more logic blocks and/or one or more registers associated with the RFFE core 202 to be set to a known condition or value when configuring the digital control interface 200 as a RFFE serial interface. Although in some cases the length of time may be application specific, in other cases the length of time may be based on characteristics of the hardware design and/or implementation. For example, the amount of time required may depend on the clock frequency, the size of the logic components, the type of components connected, directly or indirectly, to the digital control interface 200, etc. Further, setting the logic blocks and/or registers to known values may occur when initializing the RFFE core 202 or taking the RFFE core 202 out of a reset state.

In some implementations, the power on reset 210 may be configured to provide a select signal to the combinational logic block 212. For example, assume that the digital control interface 200 is configured to operate as a GPIO interface when the VIO pin 204 receives a logic low signal and as a RFFE serial interface when the VIO pin 204 receives a logic high signal. Continuing this example, when the VIO pin 204 receives a logic low signal, the select signal provided by the power on reset 210 may cause the combinational logic block 212 to output to the enable level shifter 216 and the mode level shifter 218 the signals input to the data/enable pin 208 and the clock/mode pin 206 respectively. Alternatively, if the VIO pin 204 receives a logic high signal, the select signal provided by the power on reset 210 may cause the combinational logic block 212 to output signals provided by the RFFE core 202 to the enable level shifter 216 and the mode level shifter 218. In certain embodiments, the combinational logic block 212 may delay or otherwise modify the signals received from data/enable pin 208 and the clock/mode pin 206 or the RFFE core 202 before outputting the signals to the level shifters.

Moreover, in some cases, the power on reset 210 may be configured to place one or more of the level shifters 214 into a default state. For example, the level shifters 214 may be placed into a default or reset state when the RFFE core 202 is in a reset state. In some designs, the power on reset 210 may be connected to a default high pin associated with each level shifter configured to be high during GPIO interface mode and to a default low pin associated with each level shifter configured to be low during GPIO interface mode. In some implementations, setting a level shifter 214 into a default state may cause the level shifter 214 to output a value based on a default input signal provided by the default pin 220. Although the default pin 220 is illustrated as receiving a default input signal, in a number of embodiments, the default pin 220 is tied to one of a default high and a default low input. Thus, in some cases, the default value may be pre-configured, while in other cases, the default value may be variable based on configuration or operation. It is possible in some designs that each level shifter 214 may be associated with a different default value or signal. Alternatively, each level shifter 214 may be associated with the same default value or signal.

Each of the level shifters 214 may be powered through a Vcc pin 224. In some implementations, each level shifter 214 may be separately connected to a power source. Alternatively, a single level shifter 214 may be connected, directly or indirectly, to a power source, and the remaining level shifters 214 may obtain power by a connection to the level shifter 214, or other component, that is connected to the power source. Further, the level shifters 216 and 218 may similarly each be connected to a power source, or may be connected to a level shifter or other component that can provide power to the level shifters 216 and 218. In certain embodiments, the level shifters 214, 216, and 218 are configured to adjust the voltage level of received signals and to output the modified signals. Although not limited as such, the level shifters 214, 216, and 218 may adjust the voltage level of the received signals to substantially match the voltage applied at the Vcc pin 224.

Although FIG. 2 illustrates two level shifters 214, the disclosure is not limited as such. The RFFE core 202 may communicate, directly or indirectly, with one, two, three, or any number of additional level shifters 214. Further, in some cases, the digital control interface 200 includes as many level shifters 214 as the number of registers (not shown) that the RFFE core 202 includes. Each register can provide a signal associated with the value of the register to a corresponding level shifter 214. In some cases, there may exist more or less level shifters 214 than registers. For example, each level shifter 214 may be associated with two registers. In this example, logic internal to the RFFE core 202 may determine which register's value is provided to the corresponding level shifter 214. As a second example, the RFFE core 202 may include additional registers that are included for internal use by the RFFE core 202. In this example, not all the registers of the RFFE core 202 may be associated with a level shifter 214. The level shifters 214, 216, and 218 are described in more detail below with respect to FIG. 3.

As previously indicated, the RFFE core 202 may include a set of registers (not shown). In certain situations, the set of registers may be set to unknown values. For example, when the wireless device 100 is first powered the set of registers may be set to unknown values. As a second example, in implementations where the VIO pin 204 serves as both the power source for the RFFE core 202 and the mode selector between RFFE and GPIO mode, the set of registers may be set to unknown values when the digital control interface 200 is first transitioned from a GPIO interface to a RFFE serial interface. To ensure that the registers are set to known values when the RFFE core 202 is initially powered or taken out of a reset state, the RFFE core 202 can be configured to set the value of each of the set of registers to values provided by a set of strapped defaults 222. In certain implementations, the strapped defaults 222 may be equivalent to the values provided to the default pins 220.

The RFFE core 202 may be configured to receive a clock signal from the clock/mode pin 206. This clock signal may be set to any frequency or signal shape based on the implementation of the RFFE core 202. In some implementations, the clock signal may be a square wave with a frequency of 26 MHz or less. Further, the data interface of the RFFE core 202 may be bidirectional. Thus, the RFFE core 202 may receive data from the data/enable pin 208 at the Data In of the RFFE core 202. Similarly, the RFFE core 202 may provide data from the Data Out of the RFFE core 202 to the data/enable pin 208. As illustrated in FIG. 2 by the buffers 232 and 234, both the data input and the data output may be buffered. In some embodiments, the buffers may be tri-state buffers. In some implementations, the Output Enable of the RFFE core 202 is configured to control the buffers 232 and 234 to enable both the Data Out and the Data In to share the same line to and from the data/enable pin 208. Thus, in some examples, when reading data from the RFFE core 202, the buffer 232 enables data flow, while the buffer 234 prevents data flow, or is set to high impedance. Similarly, in some examples, when writing data to the RFFE core 202, the buffer 234 enables data flow, while the buffer 232 prevents data flow, or is set to high impedance.

The following are non-limiting examples of use cases for the digital control interface 200. Other operations and uses are possible in accordance with the various embodiments described here. In one example use case, a logic low signal is received at the VIO pin 204. This signal may be received from the transceiver 114, for example. Receiving the logic low signal causes the digital control interface 200 to operate as a GPIO interface. Thus, in this example, the RFFE core 202 is inactive. Further, the combinational logic block 212 passes the signals received at the clock/mode pin 206 and the data/enable pin 208 to the mode level shifter 218 and the enable level shifter 216 respectively. The level shifters 216 and 218, upon modifying the voltage level of the signals, provide the signals to the power amplifier controller 106. The power amplifier controller 106, based on the signals received from the level shifters 216 and 218, controls the power amplifier 104 to set the level of amplification of a signal received by the power amplifier 104, such as a signal provided by the power supply 122 or the transceiver 114. The power amplifier controller 106 may also receive signals associated with a default from the level shifters 214. If so, the power amplifier controller 106 may ignore the signals from the level shifters 214 or may control the power amplifier 104 based in part on the signals received from the level shifters 214.

As a second example use case, a logic high signal is received at the VIO pin 204. This signal may be received from a baseband chip 116, for example. Receiving the logic low signal causes the digital control interface 200 to operate as a RFFE serial interface. Thus, in this example, the RFFE core 202 is active and the combinational logic block 212 passes mode and enable signals received from the RFFE core 202 to the mode level shifter 218 and the enable level shifter 216 respectively. The level shifters 216 and 218, upon modifying the voltage level of the signals, provide the signals to the power amplifier controller 106. The power amplifier controller 106 may control the power amplifier 104 based in part on the signals received from the level shifters 216 and 218. In certain embodiments, the power amplifier controller 106 may ignore the signals of the level shifters 216 and 218 when the digital control interface 200 is operating as an RFFE serial interface.

Continuing the second example use case, the RFFE core 202 may receive a clock signal from the clock/mode pin 206 and an address signal from the data/enable pin 208. Alternatively, or in addition, the RFFE core 202 may receive a data signal from the data/enable pin 208. In some cases, the data signal is received after the address signal. Alternatively, the data signal may be received before the address signal. Further, in embodiments where the digital control interface 200 includes a separate address pin (not shown), the RFFE core 202 may receive the address signal and the data signal at least partially in parallel.

The RFFE core 202 can use the clock signal to synchronize operation of one or more components associated with the RFFE core 202. Further, the clock signal can be used to facilitate identifying register addresses and data associated with a signal received from the data/enable pin 208. The RFFE core 202 may use the address signal to identify a register associated with the RFFE core 202. The RFFE core 202 may then store at the register data associated with the data signal. In some embodiments, the RFFE core 202 may modify existing data at the register based on the data signal. Further, in some cases the signal received at the data/enable pin 208 may control the RFFE core 202 or cause the RFFE core 202 to modify its operation.

In certain embodiments, the RFFE core 202 may provide one or more signals to the level shifters 214. The signals provided by the RFFE core 202 may be associated with the values and/or signals stored at the registers associated with the RFFE core 202. Further, the level shifters 214 may then provide the signals and/or modified versions of the signals to the power amplifier controller 106. The power amplifier controller 106 sets the configuration of the power amplifier 104 based at least in part on the signals from the level shifters 214, and in some cases, based at least in part on the signals from the mode level shifter 218 and/or the enable level shifter 216.

Generally, the signals received at the VIO pin 204, the clock/mode pin 206, and the data/enable pin 208 are digital signals. However, in some embodiments, one or more of the received signals may be analog signals. For instance, the signal received at the VIO pin 204 may be an analog signal. Further, each of the components illustrated in FIG. 2 can be included in a single chip or die, such as the digital control interface 108. Advantageously, in certain embodiments, including each of the components of the digital control interface 200 in a single die enables a wireless device, such as the wireless device 100, to have the capability to use the RFFE serial interface, the GPIO interface, or both types of interfaces without requiring multiple chips. By using a single chip instead of multiple chips, certain embodiments can reduce power consumption and reduce the footprint required by the control interface for the power amplifier 104, or any other module that may use a control interface.

Example of a Level Shifter

Figure 3:
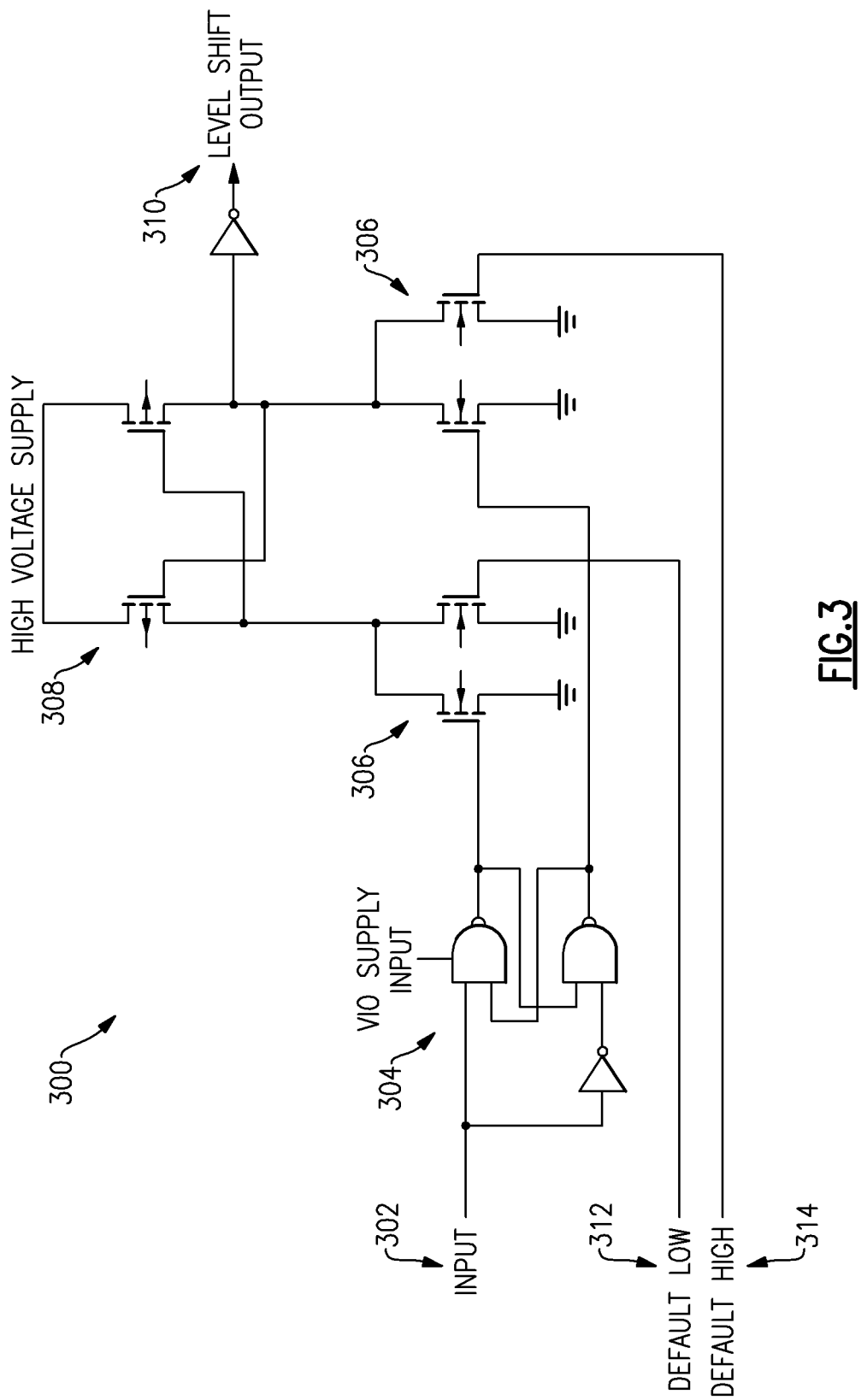
FIG. 3 illustrates an embodiment of a level shifter in accordance with aspects of the present disclosure.

FIG. 3 illustrates an embodiment of a level shifter 300 in accordance with aspects of the present disclosure. Embodiments of the level shifters 214, 216, and 218 may be equivalent to or substantially equivalent to the level shifter 300. In some implementations, the level shifters 214, 216, and 218 may differ in design from the level shifter 300. However, each of the level shifters is capable of modifying the voltage of an input signal. In some cases, the voltage of the input signal is shifted or modified to match the voltage provided at the Vcc pin 224. In other cases, the voltage of the input signal is shifted or modified within a range between the input voltage and the voltage provided at the Vcc pin 224.

During operation, the level shifter 300 is capable of receiving an input signal at an input 302. This input signal can generally include any signal that is to have its voltage level modified. Thus, for instance, the input signal can include one or more of the signals described previously with respect to FIG. 2. For example, the input signal can be a signal provided from the RFFE core 202, including from one of the registers associated with the RFFE core 202. As a second example, the input signal can be a signal provided by the combinational logic block 212.

The input signal received at the input 302 is provided to a latch 304. The latch 304 can include any type of flip-flop. For example, as illustrated in FIG. 3, the latch 304 can be a NAND based RS flip-flop. However, other types of flip-flops are possible. For example, the latch 304 can be a NOR based RS flip-flop. In certain embodiments, the latch 304 ensures a non-overlapping output from the latch 304. Ensuring a non-overlapping output ensures that each pair of NFET transistors 306 are not activated at the same time. In some embodiments, two parallel signal paths with delay elements can be used to ensure that each pair of NFET transistors 306 are not activated at the same time.

With some implementations, the latch 304 provides two signals, one signal from each of the NAND gates (e.g. a set signal and a reset signal). Each of the signals can be provided to a pair of NFET transistors 306. The NFET transistors 306 can be activated by the signals from the latch 304. When activated, the NFET transistors set the state a cross-coupled pair of PFET transistors 308. The cross-coupled pair of PFET transistors 308 causes the voltage level of the input signal to be level shifted. This level shifted signal is then provided at the output 310 to, for example, the power amplifier controller 106 or the power amplifier 104. In some embodiments, such as when a negative output voltage operation may be desired, the NFET transistors 306 can be PFET transistors and the PFET transistors 308 can be NFET transistors.

In some embodiments, it is possible that a signal is not provided at the input 302, or that the signal is substantially zero. In such embodiments, the NFET transistors 306 may be set or activated by a default signal provided by a default low input 312 and/or a default high input 314. Although FIG. 3 illustrates two defaults, the default high input 314 and the default low input 312, in a number of embodiments, only a single default signal is provided to the level shifter 300. If it is desired that the output 310 be high during reset, the default high input 314 would be configured to provide a signal during reset. If instead it is desired that the level shifter 300 provide a low output during reset, the default low input 312 would be configured to provide a signal during reset. The default input that is not configured to set the NFET transistors 306 during reset may be tied to ground, or in certain implementations, may not exist. In some implementations, the default low input 312 and/or the default high input 314 is pre-configured or connected to a signal generator that provides a pre-determined signal. Alternatively, the default low input 312 and/or the default high input 314 may be connected to the power on reset 210. In some embodiments, one or both of the default inputs 312 and 314 may be optional. For example, in some cases, the enable level shifter 216 and the mode level shifter 218 receive a signal at their input.

Example of a Process for Operation of a Digital Control Interface

Figure 4:
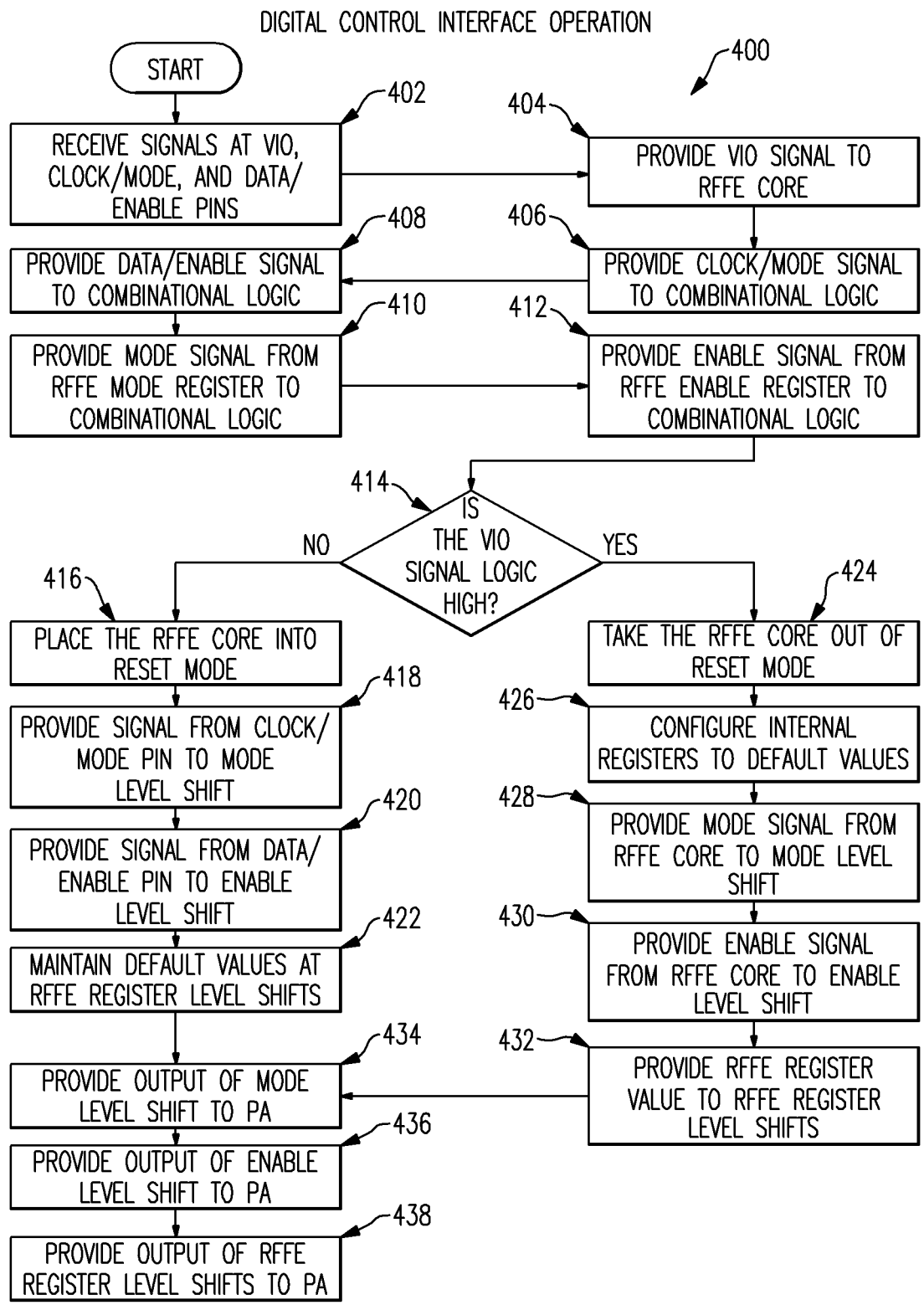
FIG. 4 presents a flowchart of a process for operation of a digital control interface in accordance with aspects of the present disclosure.

FIG. 4 presents a flowchart of a process 400 for operation of a digital control interface 200 in accordance with aspects of the present disclosure. The process 400 may be implemented by any type of digital control interface that is configured to operate as an RFFE serial interface and as a GPIO interface. For example, the process 400 can be implemented by the digital control interface 100 and the digital control interface 200. Further, the process 400, in some embodiments, can be implemented by any type of digital control interface that is configured to operate in different interface modes. Although implementation of the process 400 is not limited as such, to simplify discussion, the process 400 will be described as being implemented by the digital control interface 200.

The process 400 begins when, for example, the digital control interface 200 receives signals at the VIO pin 204, the clock/mode pin 206, and the data/enable pin 208 at block 402. In some embodiments, the signals received at one or more of the clock/mode pin 206 and the data/enable pin 208 may be delayed, may be noise, or may be some known or unknown signals that are ignored until the digital control interface 200 completes an initialization process.

The signal received at the VIO pin 204 is provided to the RFFE core 202 at block 404. In some implementations, the signal from the VIO pin 204 powers the RFFE core 202. Further, the signal, or lack thereof, from the VIO pin 204 may result in the RFFE core 202 not receiving power. In addition to providing the VIO signal to the RFFE core 202, block 404 may include providing the VIO signal to the power on reset 210. In some embodiments, the power on reset 210 may provide the signal from the VIO pin 204 to the combinational logic block 212. Further, the power on reset 210 may delay or otherwise modify the signal from the VIO in 204 before providing the delayed or modified signal to the combinational logic block 212. Similarly, in certain embodiments, the power on reset 210 may provide the VIO signal, a delayed version of the VIO signal, or a modified version of the VIO signal to a reset input associated with the RFFE core 202.

At block 406, the signal received at the clock/mode pin 206 is provided to the combinational logic block 212. Similarly, at block 408, the signal received at the data/enable pin 208 is provided to the combinational logic block 212. Further, at block 410, a mode signal from an RFFE mode register associated with the RFFE core 202 is provided to the combinational logic block 212. Similarly, at block 412, an enable signal from an RFFE enable register associated with the RFFE core 202 is provided to the combinational logic block 212. During certain operating states, the signals provided at blocks 410 and 412 may be noise or may be some known or unknown signal that does not affect the operation of the digital control interface 200. Further, in some operating states, is it possible for no signal to be provided at blocks 410 and 412. For example, in implementations where the RFFE core 202 is not powered, such as when the digital control interface 200 is operating as a GPIO interface, it is possible for no signal to be provided at the blocks 410 and 412. In some implementations, the blocks 410 and 412 may be optional.

At decision block 414, the digital control interface 200 determines whether the VIO signal is logic high. In certain implementations, determining whether the VIO signal is logic high includes configuring the digital control interface 200 based on the VIO signal. Configuring the digital control interface 200 includes adjusting the operation of portions of the digital control interface 200 as well as adjusting the flow of signals within the digital control interface 200 as is described further with respect to the remaining blocks of FIG. 4.

If at decision block 414 the VIO signal is not logic high, the digital control interface 200 operates as a GPIO interface and the process 400 proceeds to block 416 where the RFFE core 202 is placed into a reset mode. This reset mode may be an active reset where the RFFE core 202 maintains known, or unknown, values in its registers and outputs values from its output ports. Alternatively, if, for example, the logic low VIO signal is provided by grounding the VIO pin 204 or by disconnecting the VIO pin 204 from a power source, the RFFE core 202 ceases to be powered while in the reset mode.

At block 418, the signal from the clock/mode pin 206, provided at the block 406, is provided to the mode level shifter 218. Similarly, at block 420, the signal from the data/enable pin 208, provided at the block 408, is provided to the enable level shifter 216. In certain implementations, the signals provided to the level shifters at blocks 418 and 420 may be based on, or selected based on the signal provided by the power on reset 210 to the combinational logic block 212. Moreover, in some cases, the signals provided to the level shifters 218 and 216 at the blocks 418 and 420 respectively may be delayed or modified by the combinational logic block 212 before the signals are provided to the level shifters 218 and 216.

At block 422, the digital control interface 200 maintains default values at the RFFE register level shifts 214. These default values are provided via the default pin 220. In a number of implementations, the default values may be application-specific. Further, the default values may be preconfigured and/or hard-coded. Alternatively, the default values may be generated or determined based on the operation of the digital control interface 200 and/or one of more of the components associated with the wireless device 100. In certain embodiments, the block 422 may be optional.

If at decision block 414 the VIO signal is logic high, the digital control interface 200 operates as an RFFE serial interface and the process 400 proceeds to block 424 where the RFFE core 202 is taken out of a reset mode. In some cases, the process 400 is performed when the wireless device 100 is first powered or initialized after a time period of not being powered. In such cases, the block 424 may be performed as part of the initialization of the digital control interface 200. Further, the block 424 may include initializing the RFFE core 202 instead of, or in addition to, taking the RFFE core 202 out of a reset mode. Removing the RFFE core 202 from reset mode may be a delayed process to provide sufficient time for one or more registers, signals, and/or components associated with the RFFE core 202 to stabilize and/or be initialized. This delay process may be controlled and/or implemented by the power on reset 210. In some embodiments, the block 424 may be optional.

At block 426, the process 400 includes configuring internal registers (not shown) associated with the RFFE core 202 to a set of default values. These default values may be provided by the strapped defaults 222. Alternatively, the default values may be determined based on internal logic associated with the RFFE core 202 and set in response to signals received from one or more of the VIO pin 204, the clock/mode pin 206, and the data/enable pin 208.

At block 428, a mode signal from the RFFE core 202 is provided to the mode level shifter 218. This mode signal may be associated or obtained from a mode register of the RFFE core 202. Alternatively, or in addition, the mode signal may be based, at least in part, on one or more of the following: a signal received from the clock/mode pin 206, a signal received from the data/enable pin 208, a value based on the strapped defaults 222, and logic internal to the RFFE core 202.

Further, at block 430, an enable signal from the RFFE core 202 is provided to the enable level shifter 216. This enable signal may be associated or obtained from an enable register of the RFFE core 202. Alternatively, or in addition, the enable signal may be based, at least in part, on one or more of the following: a signal received from the clock/mode pin 206, a signal received from the data/enable pin 208, a value based on the strapped defaults 222, and logic internal to the RFFE core 202.

In certain implementations, the signals provided to the level shifters at blocks 428 and 430 may be based on, or selected based on the signal provided by the power on reset 210 to the combinational logic block 212. Moreover, in some cases, the signals provided to the level shifters 218 and 216 at the blocks 428 and 430 respectively may be delayed or modified by the combinational logic block 212 before the signals are provided to the level shifters 218 and 216.

At block 432, the process 400 includes providing RFFE register values, or signals associated with RFFE registers, to the RFFE level shifters 214. The RFFE register values are from registers associated with the RFFE core 202. Although in some cases these registers may include the registers described above with respect to the blocks 428 and 430, generally the registers of block 432 are different registers. Further, the values provided by the registers are used to set or to specify the mode of the power amplifier 104. While in GPIO interface mode, the digital control interface 200 may be limited to specifying two modes, such as high and low, associated with two voltage values and/or two levels of power amplification. In embodiments where the digital control interface includes additional pins, the digital control interface 200 may be capable of specifying additional modes while in GPIO mode. While in RFFE serial interface mode, the digital control interface 200 may set or specify different modes for the power amplifier 104 based on values clocked in to the RFFE core 202, values stored in registers associated with the RFFE core 202, or a combination of the two.

Regardless of whether the VIO signal is logic high or logic low, the output of the mode level shifter 218 is provided to the power amplifier 104 at block 434. Similarly, regardless of whether the VIO signal is logic high or logic low, the output of the enable level shifter 216 is provided to the power amplifier 104 at block 434. In certain embodiments, the outputs of the mode level shifter 218 and the enable level shifter 216 are provided to the power amplifier controller 106. The power amplifier controller 106 may then configure the power amplifier 104 based, at least in part, on the received signals from the mode level shifter 218 and the enable level shifter 216.

At block 438, the outputs of the RFFE level shifters 214 are provided to the power amplifier 104. Alternatively, the outputs of the RFFE level shifters 214 may be provided to the power amplifier controller 106, which may then configure the power amplifier 104 based, at least in part, on the received signals from the RFFE level shifters 214. When the digital control interface 200 is operating as a GPIO interface, the output of the RFFE level shifters 214 may be based, at least in part, on the default values or signals received at the default pins 220. In contrast, when the digital control interface 200 is operating as a RFFE serial interface, the output of the RFFE level shifters 214 may be based, at least in part, on values or signals received from the RFFE core 202, including values stored in registers associated with the RFFE core 202. In some embodiments, one or more of the block 434, 436, and 438 may be optional. For example, when the digital control interface 200 is operating as a GPIO interface, the level shifters 214 may not provide values to the power amplifier 104, or the power amplifier controller 106.

Second Example of an Electronic Device

Figure 5:
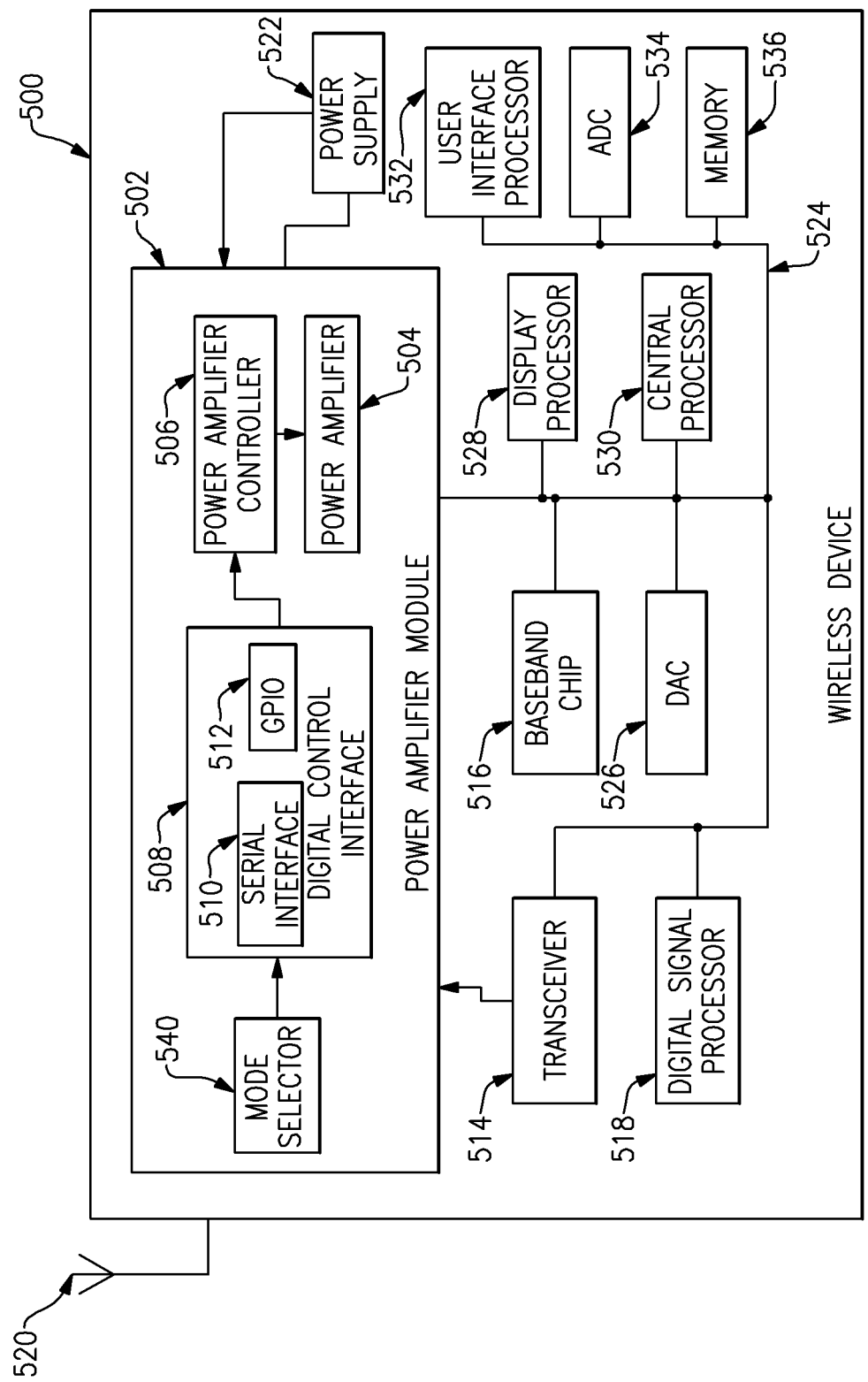
FIG. 5 illustrates an embodiment of a wireless device in accordance with aspects of the present disclosure.

FIG. 5 illustrates an embodiment of a wireless device 500 in accordance with aspects of the present disclosure. In some implementations, some or all of the embodiments described above with respect to the wireless device 100 may apply to the wireless device 500.

The wireless device 500 can include a power amplifier module 502. The power amplifier module 502 can generally include any component or device that includes a power amplifier 504, a power amplifier controller 506 for controlling the power amplifier 504, a digital control interface 508, and a mode selector 540. Although not limited as such, controlling the power amplifier 504 generally refers to setting, modifying, or adjusting the amount of power amplification provided by the power amplifier 504.

As with the digital control interface 108, the digital control interface 508 can include any type of control interface that can support multiple types of interfaces for controlling the power amplifier 504 and/or for configuring the power amplifier controller 506 to control the power amplifier 504. For example, the digital control interface 508 can include a serial interface 510 and a GPIO interface 512. The serial interface 510 can include any type of serial interface. For example, the serial interface can be a RFFE serial interface (e.g., the MIPI® RFFE serial interface), a Serial Peripheral Interface (SPI) Bus, a 3-wire serial bus, or an I²C bus, to name a few. In some implementations, some or all of the embodiments described above with respect to the digital control interface 108 may apply to the digital control interface 508.

In a number of embodiments, the digital control interface 508 can include multiple interface types on the same component die without requiring circuit design changes or bonding changes to existing component die configurations (e.g., existing power amplifiers, existing power amplifier modules, existing transceivers, or other components that may provide control signals to a digital control interface or that may receive control signals from a digital control interface). Further, in some embodiments, the digital control interface 508 can support multiple interfaces without increasing the number of interface connections (e.g., pins, leads, wires, Ball Grid Arrays, etc.) exposed for use by the wireless device 500 or the power amplifier module 508. Advantageously, in a number of embodiments, the digital control interface 508 can be used with devices that support different interface standards without modifying the digital control interface 508. For example, the illustrated digital control interface 508 of FIG. 5, can be used with devices that support a serial interface, a GPIO interface, or a combination of the two without modifying the digital control interface 108. In some cases, the digital control interface 508 can switch between different interface types during operation.

The mode selector 540 can include any device or component configured to select the mode of operation of the digital control interface 508. Selecting the mode of operation of the digital control interface 508 can include selecting the type of interface the digital control interface 508 uses to communicate with the power amplifier controller 506. For example, the mode selector 540 can select or configure the digital control interface 508 to act as a serial interface or a GPIO interface. This selection may be based on a signal received from the antenna 520, the transceiver 514, a baseband chip 516, or any other signal source that may provide a signal that can be used to select the interface type or to determine the interface type to select from the available interface types of the digital control interface 508.

Further, in certain implementations, the digital control interface 508 can set the mode of operation of the power amplifier 504, either directly or via the power amplifier controller 506, based on one or more signals received from the signal source. In certain embodiments, the digital control interface 508 receives the one or more signals that cause the digital controller interface 508 to set the mode of operation of the power amplifier 504 from, for example, the antenna 520, the transceiver 514, the baseband 516, or the DSP 518 while receiving the signal that selects the operative interface type of the digital control interface 508 from the mode selector 540. Alternatively, the digital control interface 508 may receive the one or more signals that cause the digital control interface 508 to set the mode of operation of the power amplifier 504 and the signal that selects the operative interface type of the digital control interface 508 from the mode selector 540. The mode selector 540 may receive some or all of the signals from, for example, the antenna 520, the transceiver 514, the baseband 516, or the DSP 518. Alternatively, or in addition, the mode selector 540 may generate some or all of the signals provided to the digital control interface 508 based on one or more signals received from, for example, the antenna 520, the transceiver 514, the baseband 516, or the DSP 518.

In one example of a scenario for setting the mode of the power amplifier 504, the transceiver 514 receives a signal from, for example, the antenna 520 or the DSP 518. In response to receiving the signal, the transceiver 514 can provide one or more signals to the mode selector 540. Based on the one or more signals received from the transceiver 514, the mode selector 540 can configure the digital control interface 508 to operate as either a serial interface or a GPIO interface. Further, the transceiver 514 can provide one or more signals to the digital control interface 508, which processes the signals in serial mode or GPIO mode based on the mode specified by the mode selector 540. Based on the outcome of processing the signals, the digital control interface 508 can provide one or more mode setting signals to the power amplifier controller 506, which can set the mode of the power amplifier 504 based on the mode setting signals. Alternatively, the digital control interface 508 may set the mode of the power amplifier 504.

In some implementations, the power amplifier 504 may include one or more of the power amplifier controller 506, the digital control interface 508, and the mode selector 540.

For some implementations, the power amplifier controller 506 may include one or more of the digital control interface 508 and the mode selector 540. Moreover, in some cases, the digital control interface may include the mode selector 540. Further, the power amplifier module 502 may be a single component that includes the functionality of the mode selector 540, the digital control interface 508, the power amplifier controller 506, and the power amplifier 504. Alternatively, the power amplifier module 502 may include multiple components that include the functionality of the mode selector 540, the digital control interface 508, the power amplifier controller 506, and the power amplifier 504. In yet other implementations, the wireless device 500 may include one or more components that include the functionality of the mode selector 540, the digital control interface 508, the power amplifier controller 506, and the power amplifier 504.

Similar to the power amplifier module 102, the power amplifier module 502 can receive power from a power supply 522. The power amplifier module 502 can then distribute the power to a number of components included in the wireless device 500 via, for example, the power distribution bus 524.

In certain embodiments, the power supply 522 includes combinational logic and/or one or more processors that enable the power supply 522, in some cases, to configure one or more elements of the power amplifier module 502. For example, in some cases, the power supply 522 may provide one or more signals to the digital control interface 508 to enable the digital control interface 508 to configure the power amplifier 504. Further, the power supply 522 may provide the signals to, for example, the digital control interface 508 based on the output of the power amplifier 504 thereby creating a feedback loop between the power amplifier module 502 and the power supply 522.

The wireless device 500 can include a number of additional components. At least some of these additional components may receive power via the power distribution bus 524. For example, the wireless device 500 can include a digital to analog convertor (DAC) 526, a display processor 528, a central processor 530, a user interface processor 532, an analog to digital convertor (ADC) 534, and memory 536. At least some of the additional components may communicate with the digital control interface 508 and may cause the digital control interface 508 to modify the settings of the power amplifier module 502, the power amplifier 504, and/or the power amplifier controller 506. In addition, at least some of the additional components may communicate with the mode selector 540 and cause the mode selector 540 to select the operational mode of the digital control interface 508.

Second Example of a Digital Control Interface

Figure 6:
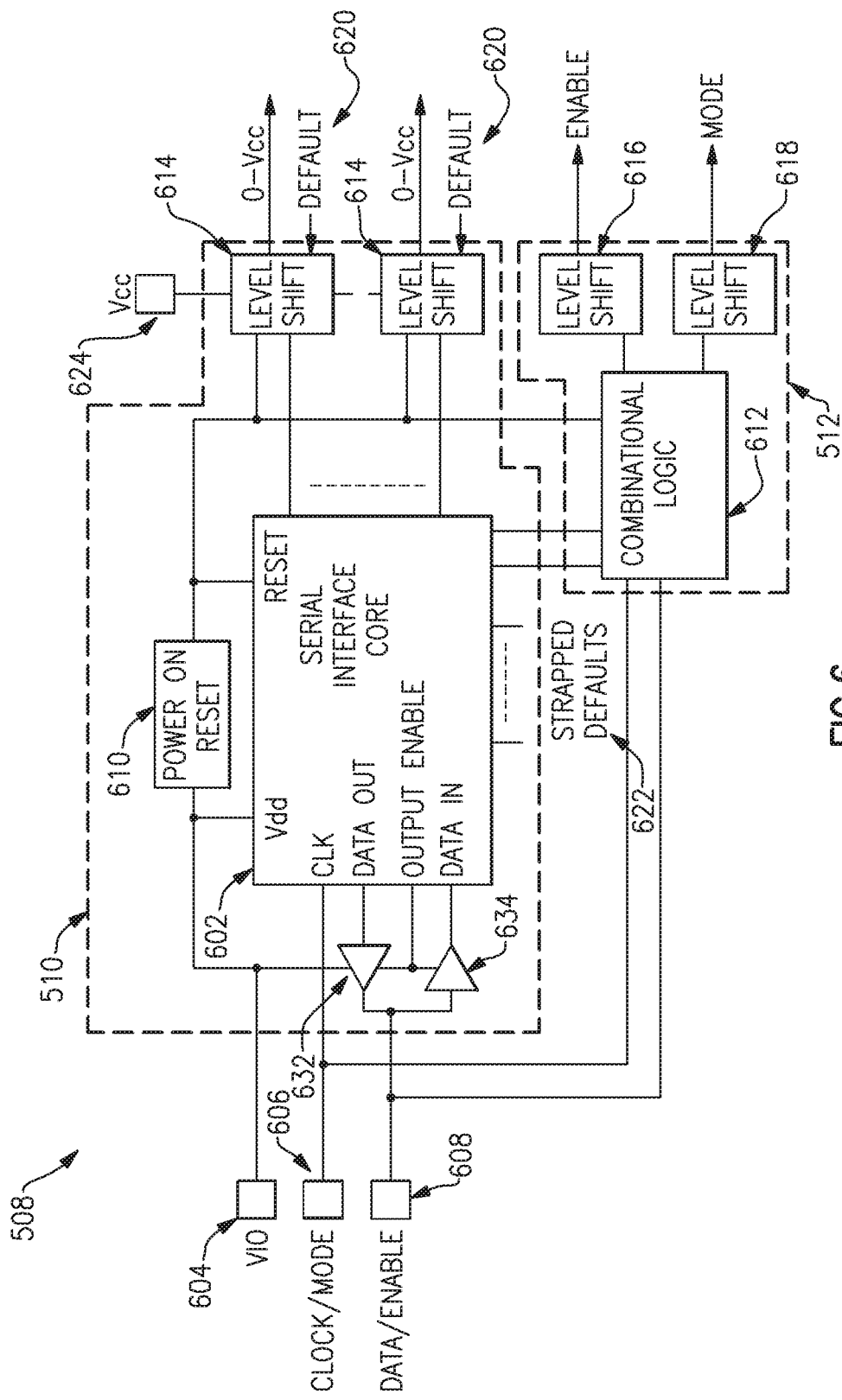
FIG. 6 illustrates an embodiment of a digital control interface in accordance with aspects of the present disclosure.

FIG. 6 illustrates an embodiment of a digital control interface 508 in accordance with aspects of the present disclosure. In some implementations, some or all of the embodiments described above with respect to the digital control interface 108 and the digital control interface 200 may apply to the digital control interface 508.

The digital control interface 508 includes a serial interface 510, a GPIO interface 512, and a number of input pins. These input pins can include a VIO pin 604, a clock/mode pin 606, and a data/enable pin 608.

The VIO pin 604 may be configured to receive a signal setting the digital control interface 508 to operate as either a serial interface or a GPIO interface. In the illustrated embodiment, the digital control interface 508 operates as a serial interface when the VIO pin 604 receives a logic high signal and operates as a GPIO interface when the VIO pin 604 receives a logic low signal. However, in some implementations, the digital control interface 508 can be configured to operate as a serial interface when the VIO pin 604 receives a logic low signal and as a GPIO interface when the VIO pin 604 receives a logic high signal. The logic low signal can be associated with any value defined to be low, such as 0 volts, −5 volts, or otherwise. Similarly, the logic high signal can be associated with any value defined to be high, such as 0 volts, +5 volts, or otherwise. In some implementations, the logic low signal may be associated with connecting the VIO pin 604 to ground. Similarly, in some cases, the logic high signal may be associated with connecting the VIO pin 604 to a voltage source.

Further, the VIO pin 604 may be configured to provide power from a power source, such as the power supply 522, to the serial interface core 602. Thus, in some embodiments, when the VIO pin 604 is set to logic low, or is grounded, the serial interface core 602 is not powered and the digital control interface 508 is configured to function as a GPIO interface. On the other hand, in some embodiments, when the VIO pin 604 is set to logic high, or is connected, directly or indirectly, to a power source, the serial interface 602 is provided with power and the digital control interface 508 is configured to function as a serial interface. In some implementations, some or all of the embodiments described above with respect to the VIO pin 204 may apply to the VIO pin 604.

The serial interface 510 may include a front end core, or a serial interface core 602. Further, the serial interface 510 may include a power on reset 610, a pair of buffers 632 and 634, and a number of level shifters 614. The GPIO interface 512 may include combinational logic block 612, and a pair of level shifters 616 and 618. When the digital control interface 508 functions as a serial interface, the components of the serial interface 510 are active or operate to provide a serial interface and one or more components of the GPIO interface 512 may not be active. Similarly, when the digital control interface 508 functions as a GPIO interface, the components of the GPIO interface 512 are active or operate to provide a GPIO interface and one or more components of the serial interface 510 may not be active.

However, in certain embodiments, when the digital control interface 508 functions as a serial interface, the digital control interface 508 may use one or more components of the GPIO interface 512 to facilitate providing a serial interface, and thus, one or more components of the GPIO interface 512 may be active or operate to provide the serial interface. Similarly, in certain embodiments, when the digital control interface 508 functions as a GPIO interface, the digital control interface 508 may use one or more components of the serial interface 510 to facilitate providing a GPIO interface, and thus, one or more components of the serial interface 510 may be active or operate to provide the GPIO interface. For example, in some implementations, the combinational logic block 612 may include a multiplexor that is controlled by the power on reset 610. Further, in this example, the combinational logic block 612, based on the mode of operation of the digital control interface 508, and therefore the value output by the power on reset 610, may provide different signals to the level shifters 616 and 618. Thus, in this example, although the power on reset 610 is generally part of the serial interface 510, the power on reset 610 may function as part of the GPIO interface when the digital control interface is in GPIO interface mode. Similarly, in this example, although the combinational logic block 612 and the level shifters 616 and 618 are generally part of the GPIO interface 512, one or more of the combinational logic block 612 and the level shifters 616 and 618 may operate to help provide a serial interface when the digital control interface 508 is in serial interface mode.

The power on reset 610 may be implemented in hardware, software, or a combination of the two. Further, the power on reset 610 may be configured to facilitate resetting a serial interface core 602. In some embodiments, the power on reset 610 can serve as an inverted delay function. The inverted delay function is configured to provide sufficient time for one or more logic blocks and/or one or more registers associated with the serial interface core 602 to be set to a known condition or value when configuring the digital control interface 508 as a serial interface. Although, in some cases, the length of time may be application specific, in other cases the length of time may be based on characteristics of the hardware design and/or implementation. For example, the amount of time required may depend on the clock frequency, the size of the logic components, the type of components connected, directly or indirectly, to the digital control interface 200, etc. Further, setting the logic blocks and/or registers to known values may occur when initializing the serial interface core 602 or taking the serial interface core 602 out of a reset state.

In some implementations, the power on reset 610 may be configured to provide a select signal to the combinational logic block 612. For example, assume that the digital control interface 508 is configured to operate as a GPIO interface when the VIO pin 604 receives a logic low signal and as a serial interface when the VIO pin 604 receives a logic high signal. Continuing this example, when the VIO pin 604 receives a logic low signal, the select signal provided by the power on reset 610 may cause the combinational logic block 612 to output to the enable level shifter 616 and the mode level shifter 618 signals based on the input to the data/enable pin 608 and the clock/mode pin 606 respectively. For instance, the combinational logic block 612 may decode the signals received from the clock/mode pin 606 and the data/enable pin 608 and provide the decoded signals to the enable level shifter 616 and the mode level shifter 618.

If, in this example, the VIO pin 604 receives a logic high signal instead of the logic low signal, the select signal provided by the power on reset 610 may cause the combinational logic block 612 to output signals based on signals received from the serial interface core 602 to the enable level shifter 616 and the mode level shifter 618. In certain embodiments, the combinational logic block 612 may delay or otherwise modify the signals received from data/enable pin 608 and the clock/mode pin 606 or the serial interface core 602 before outputting the signals to the level shifters 616 and 618.

In some cases, the power on reset 610 may be configured to place one or more of the level shifters 614 into a default or reset state. This may occur, for example, when the serial interface core 602 is in a reset state. In some designs, the power on reset 610 may be connected to a default high pin associated with each level shifter configured to be high during GPIO interface mode and to a default low pin associated with each level shifter configured to be low during GPIO interface mode. In some implementations, setting a level shifter 614 into a default state may cause the level shifter 614 to output a value based on a default input signal provided by the default pin 620. Although the default pin 620 is illustrated as receiving a default input signal, in a number of embodiments, the default pin 620 is tied to one of a default high and a default low input. Thus, in some cases, the default value may be pre-configured, while in other cases, the default value may be application specific and may vary based on the configuration or operation of the digital control interface 508 or the power amplifier module. It is possible in some designs that each level shifter 614 may be associated with a different default value or signal. Alternatively, each level shifter 614 may be associated with the same default value or signal.

Each of the level shifters 614 may be powered through a Vcc pin 624. In some implementations, each level shifter 614 may be separately connected to a power source. Alternatively, a single level shifter 614 may be connected, directly or indirectly, to a power source, and the remaining level shifters 614 may obtain power by a connection to the level shifter 614, or other component, that is connected to the power source. Further, the level shifters 616 and 618 may similarly each be connected to a power source, or may be connected to a level shifter or other component that can provide power to the level shifters 616 and 618. In certain embodiments, the level shifters 614, 616, and 618 are configured to adjust the voltage level of received signals and to output the modified signals. Although not limited as such, the level shifters 614, 616, and 618 may adjust the voltage level of the received signals to substantially match the voltage applied at the Vcc pin 624.

In some implementations, some or all of the embodiments described above with respect to the power on reset 210 may apply to the power on reset 610. Similarly, in some implementations, some or all of the embodiments described above with respect to the level shifters 220 may apply to the level shifters 614. Further, in some implementations, some or all of the embodiments described above with respect to the level shifters 216 and 218 may apply to the level shifters 616 and 618 respectively. In addition, some or all of the embodiments described above with respect to the level shifter 300 may apply to the level shifters 614, 616, and 618.

The serial interface core 602 may generally include circuitry or logic that enables the serial interface core to provide a serial interface. In some embodiments, the serial interface core 602 can include a RFFE core (e.g. the RFFE core 202). Further, in some instances, the serial interface core 602 can include some or all of the embodiments described above with respect to the RFFE core 202.

As with the RFFE core 202, the serial interface core 602 may include a set of registers (not shown). In certain situations, the set of registers may be set to unknown values. For example, when the wireless device 500 is first powered, the set of registers may be set to unknown values. As a second example, in implementations where the VIO pin 604 serves as both the power source for the serial interface core 602 and the mode selector between serial interface mode and GPIO interface mode, the set of registers may be set to unknown values when the digital control interface 508 is first transitioned from a GPIO interface to a serial interface. To ensure that the registers are set to known values when the serial interface core 602 is initially powered or taken out of a reset state, the serial interface core 602 can be configured to set the value of each of the set of registers to values provided by a set of strapped defaults 622. In certain implementations, the strapped defaults 622 may be equivalent to the values provided to the default pins 620.

In certain embodiments, the serial interface core 602 may be configured to receive a clock signal from the clock/mode pin 606. This clock signal may be set to any frequency or signal shape based on the implementation of the serial interface core 602. In some implementations, the clock signal may be a square wave with a frequency of 26 MHz or less. Further, the data interface of the serial interface core 602 may be bidirectional. Thus, the serial interface core 602 may receive data from the data/enable pin 808 at the Data In of the serial interface core 602. Similarly, the serial interface core 602 may provide data from the Data Out of the serial interface core 602 to the data/enable pin 608. As illustrated in FIG. 6 by the buffers 632 and 634, both the data input and the data output may be buffered. In some embodiments, the buffers may be tri-state buffers. Further, the Output Enable of the serial interface core 602 may be configured to control the buffers 632 and 634 to enable both the Data Out and the Data In to share the same line to and from the data/enable pin 608. Thus, in some examples, when reading data from the serial interface core 602, the buffer 632 enables data flow, while the buffer 634 prevents data flow, or is set to high impedance. Similarly, in some examples, when writing data to the serial interface core 602, the buffer 634 enables data flow, while the buffer 632 prevents data flow, or is set to high impedance.

The combinational logic block 612 generally includes any logic that causes the digital control interface 508 to provide an enable signal and a mode signal to the enable level shifter 616 and the mode level shifter 618 respectively. In some embodiments, the combinational logic block 612 includes logic that enables the decoding of a signal. The combinational logic block 612 can then provide a decoded signal to one or both of the level shifters 616 and 618. In some instances, the combinational logic block 612 can include some or all of the embodiments described above with respect to the combinational logic block 212.

In some implementations, the digital control interface 508 can perform the process 400 described above with respect to FIG. 4. In such implementations, operations associated with the RFFE core may instead be performed by the serial interface core 602. For example, block 416 may include placing the serial interface core 602 into a reset mode. As a second example, block 432 may include providing serial interface register values, or signals associated with registers of the serial interface core 602, to the serial interface level shifters 614.

Example of a Combinational Logic Block

Figure 7:
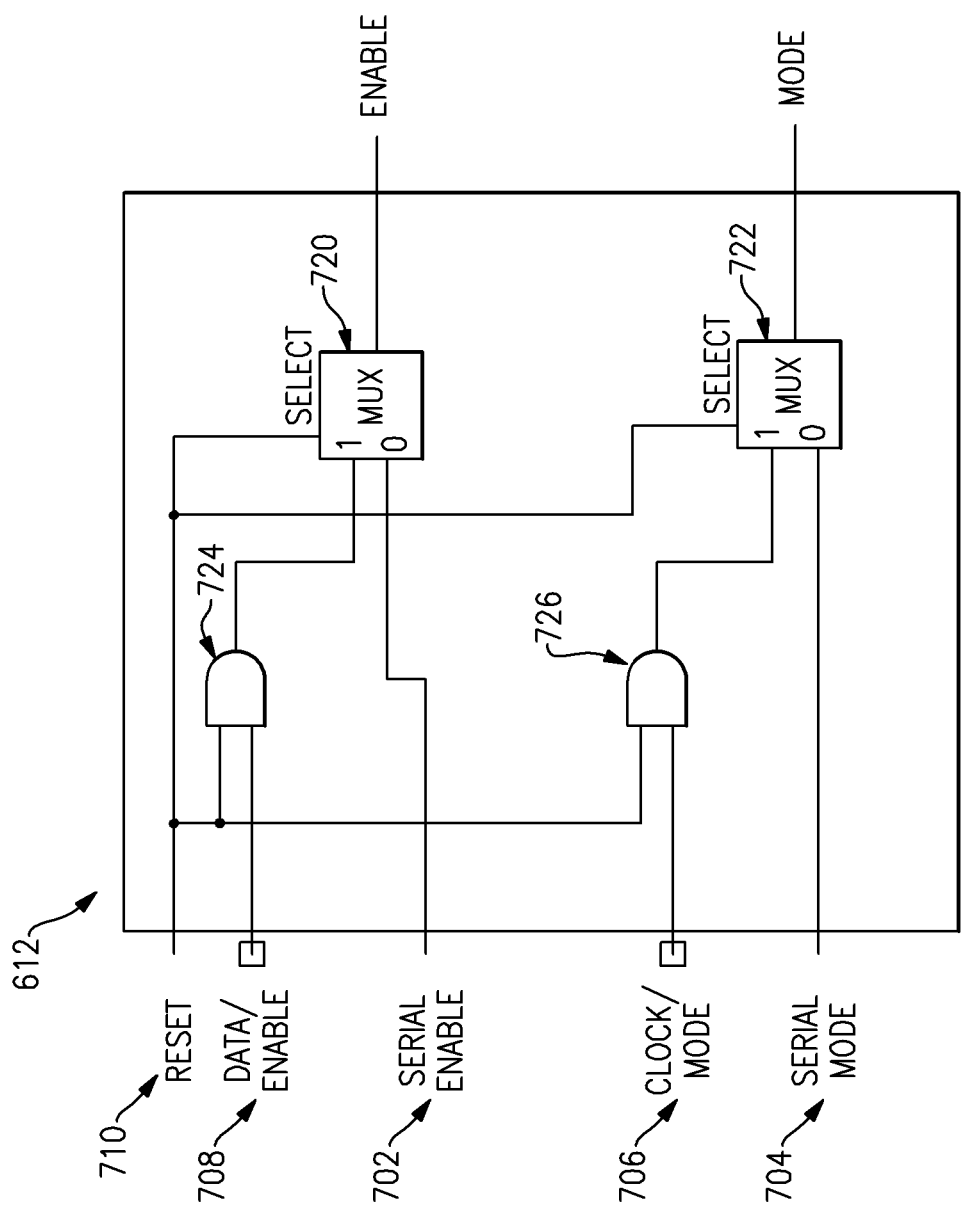
FIG. 7 illustrates an embodiment of a combinational logic block in accordance with aspects of the present disclosure.

FIG. 7 illustrates an embodiment of a combinational logic block 612 in accordance with aspects of the present disclosure. As described above, the combinational logic block 612 may be configured to output an enable signal and a mode signal to the level shifters 616 and 618 respectively. Further, the combinational logic block 612 includes logic that determines whether the enable and mode signals are based on inputs received from the serial interface core 602 or inputs received from the clock/mode pin 606 and data/enable pin 608. In some cases, when the digital control interface 508 is operating as a GPIO interface, the enable signal and mode signal may be based on inputs received via additional logic or devices (not shown) that receive the input signals from the clock/mode pin 606 and data/enable pin 608. Similarly, in some cases, when the digital control interface 508 is operating as a serial interface, the enable signal and mode signal may be based on inputs received via additional logic or devices (not shown) that receive the signals from the serial interface core 602. In some cases, the additional logic or devices may process the signals before providing the signals to the combinational logic block 612.

As illustrated in FIG. 7, the combinational logic block 612 includes multiplexor 720 and multiplexor 722. The multiplexor 720 can provide the enable signal to the enable level shifter 616 and the multiplexor 722 can provide the mode signal to the mode level shifter 618. Each of the multiplexors may be controlled by a reset signal received from the reset input 710 to the combinational logic block 612. As described above, the reset signal may be received from the power on reset 610 and, in some cases, may be an inverted version of a signal received from the VIO pin 604.

As previously described, in some embodiments, when the reset signal received at the reset input 710 to the combinational logic block 612 is logic high, or a '1', the digital control interface 508 operates as a GPIO interface. In such cases, the multiplexor 720 outputs the signal received at the data/enable input 708, and the multiplexor 722 outputs the signal received at the clock/mode input 706. As illustrated by the small squares, the inputs to the data/enable input 708 and the clock/mode input 706 may, in some cases, be received from the data/enable pin 608 and the clock/mode pin 606 respectively, without any intervening logic or components. In other embodiments, there may be additional logic between the pins 606 and 608, and the inputs 706 and 708 respectively.

In some embodiments, the combinational logic block 612 may include an AND gate 724 between the data/enable input 708 and the multiplexor 720, and/or an AND gate 726 between the clock/mode input 706 and the multiplexor 722. Although some embodiments include the AND gates, since the reset input 710 is logic high when selecting the input of the data/enable input 708 and the clock/mode input 706, the output of the multiplexors does not change. In certain embodiments, the AND gates are included to reduce or eliminate digital noise caused by the frequency of the signals and/or the proximity of the signal paths to each other. The data and clock signals, in some cases, may be high speed digital signals, which in some implementations can be as fast as 26 MHz. In other cases, the signals may be faster or slower than 26 MHZ and may be application dependent. The AND gates can be used to limit the number of nodes that toggle at the rate of the signals thereby limiting the amount of clock energy that can degrade the RF performance aspects of one or more devices in communication with the combinational logic block 612 (e.g., the power amplifier controller 506, the power amplifier 504, etc.). In some cases, the AND gates may introduce a delay enabling synchronization of one or more signals. In certain embodiments, the AND gates may be optional.

Although the combinational logic block 612 of FIG. 7 includes AND gates, it is possible for the combinational logic block 612 to include other types of logic in addition to, or in place of the AND gates 724 and 726. For example, the combinational logic block 612 may include one or more AND gates, NAND gates, inverters, OR gates, NOR gates, or XOR gates between the inputs 708 and 706 and the multiplexors 720 and 722 respectively.

When the reset signal received at the reset input 710 to the combinational logic block 612 is logic low, or a '0', the digital control interface 508 operates as a serial interface. In such cases, the multiplexor 720 outputs the signal received at the serial enable input 702, and the multiplexor 722 outputs the signal received at the serial mode input 704.

Although FIG. 7 does not illustrate any additional logic than has previously been described, in some implementations, the combinational logic block 612 may include additional logic components. For example, additional gates may be included to reduce noise, delay the timing of signals, or to store prior signals.

Third Example of a Digital Control Interface

Figure 8:
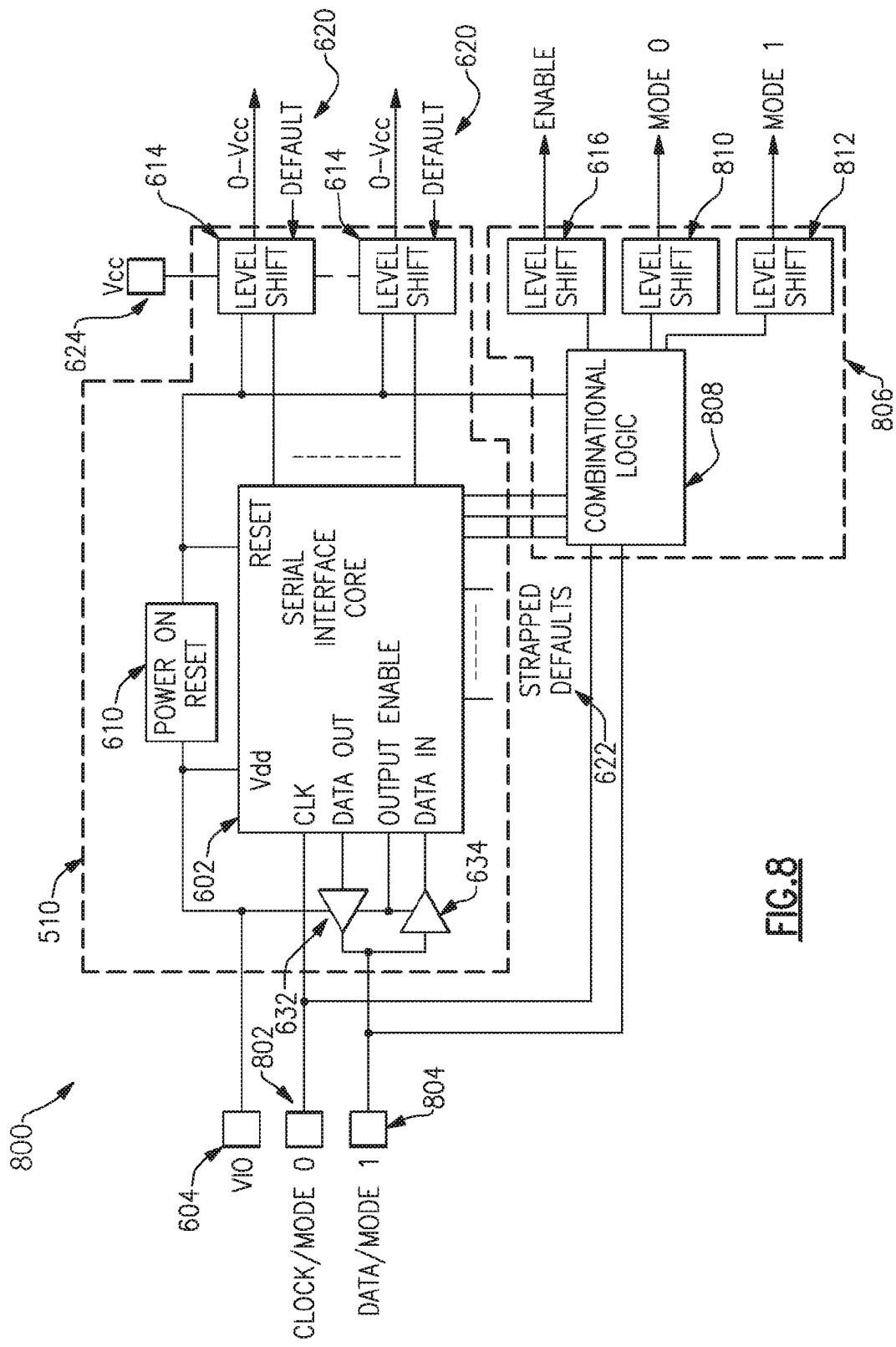
FIG. 8 illustrates an embodiment of a digital control interface in accordance with aspects of the present disclosure.

FIG. 8 illustrates an embodiment of a digital control interface 800 in accordance with aspects of the present disclosure. In some cases, the digital control interface 800 may substitute for the digital control interface 508 (illustrated in FIG. 6) of the wireless device 500 (illustrated in FIG. 5). In some implementations, some or all of the embodiments described above with respect to the digital control interface 108, the digital control interface 200, and the digital control interface 508 may apply to the digital control interface 800. To simplify discussion, elements in common between the digital control interface 508 and the digital control interface 800 are not redescribed below.

Advantageously, in certain embodiments, the digital control interface 800 can support three modes when configured as a GPIO interface. In some cases, by enabling the digital control interface 800 to support three modes when configured as a GPIO interface, the digital control interface 800 is able to support more power amplifier modes than a signal control interface that uses separate mode and enable pins. Further, in some cases, the additional modes can supported without adding additional pin inputs and without expanding the package size of the digital control interface. In some implementations, these advantages can be achieved by replacing the data/enable pin 608 of the digital control interface 508 with a pin that provides a second mode input and by modifying the combinational logic block 612 to interpret the fourth available mode as a not enabled signal.

As illustrated in FIG. 8, the digital control interface 800 can include a clock/mode 0 pin 802 and a data/mode 1 pin 804. The pins 802 and 804 can be configured similarly to the pins 606 and 608 of the digital control interface 508 respectively. However, when the digital control interface 800 is configured as a GPIO interface, the clock/mode 0 pin 802 can provide a first mode signal to the combinational logic block 808 and the clock/mode 1 pin 804 can provide a second mode signal to the combinational logic block 808.

The GPIO interface 806 can include two mode level shifters, the mode 0 level shifter 810 and the mode 1 level shifter 812. When the signal output by enable level shifter 616 indicates that the power amplifier 504 should be enabled, the signals output by the two mode level shifters can be used by the power amplifier controller 506 to set the level of amplification of a signal received by the power amplifier 504. In some embodiments, the power amplifier 504 is enabled regardless of the output of the enable level shifter 616. In some such cases, the output of the enable level shifter 616 may be used by the power amplifier controller 506 to determine whether to adjust the mode of the power amplifier 504 based on the outputs of the two mode level shifters 810 and 812.

As will be described in more detail below with respect to FIG. 9, the signal supplied to the enable level shifter 616 may be based on the signals received at the mode pins 802 and 804. Further, in some cases, the serial interface core 602 may provide three signal connections to the combinational logic block 808, as illustrated in FIG. 8. In other cases, the serial interface core 602 may provide more or less signal lines to the combinational logic block 808. In such cases, the signal lines may be combined or split using one or more logic blocks and based, at least in part, on the number of level shifters receiving output signals from the combinational logic block 808.

Second Example of a Combinational Logic Block

Figure 9:
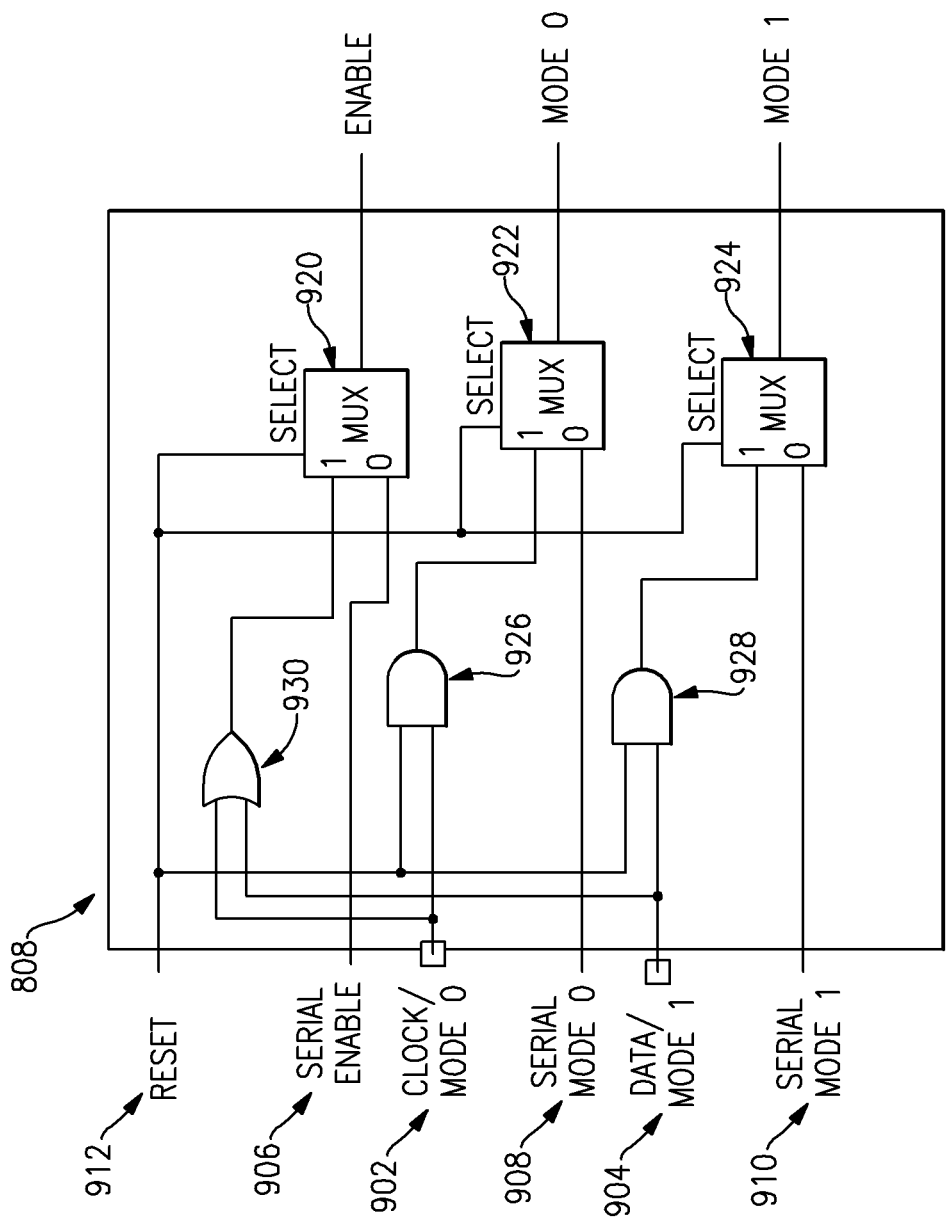
FIG. 9 illustrates an embodiment of a combinational logic block in accordance with aspects of the present disclosure.

FIG. 9 illustrates an embodiment of a combinational logic block 808 in accordance with aspects of the present disclosure. In some embodiments, the combinational logic block 808 may include some or all of the embodiments as previously described with respect to the combinational logic block 612.

Similar to the combinational logic block 612, the combinational logic block 808 includes logic that determines whether the enable and mode signals are based on inputs received from the serial interface core 602 or inputs received from the clock/mode 0 pin 802 and data/mode 1 pin 804. In some cases, when the digital control interface 800 is operating as a GPIO interface, the enable signal and the mode 0 and mode 1 signals may be based on inputs received via additional logic or devices (not shown) that receive the input signals from the clock/mode 0 pin 802 and data/mode 1 pin 804. Similarly, in some cases, when the digital control interface 800 is operating as a serial interface, the enable signal and the mode 0 and mode 1 signals may be based on inputs received via additional logic or devices (not shown) that receive the signals from the serial interface core 602. In some cases, the additional logic or devices may process the signals before providing the signals to the combinational logic block 808.

As illustrated in FIG. 9, the combinational logic block 808 includes three multiplexors. The multiplexor 920 can provide the enable signal to the enable level shifter 616. When the digital control interface 800 is configured as a serial interface, the multiplexor 920 outputs an enable signal received from the serial interface core 602 via the serial enable input 906. When the digital control interface 800 is configured as a GPIO interface, the multiplexor 920 outputs an enable signal that is based on the logical OR of the signals received from the clock/mode 0 input 902 and the data/mode 1 input 904. The logical OR may be obtained via the OR gate 930 illustrated in FIG. 9. However, other logical equivalents are possible, such as by using a NOR gate and an inverter.

The multiplexor 922 can provide a first mode signal, or the mode 0 signal, to the mode 0 level shifter 810. Similarly, the multiplexor 924 can provide a second mode signal, or the mode 1 signal, to the mode 1 level shifter 812. When the digital control interface 800 is configured as a serial interface, the multiplexor 922 outputs a mode 0 signal received from the serial interface core 602 via the serial mode 0 input 908. Likewise, when the digital control interface 800 is configured as a serial interface, the multiplexor 924 outputs a mode 1 signal received from the serial interface core 602 via the serial mode 1 input 910.

When the digital control interface 800 is configured as a GPIO interface, the multiplexor 922 outputs the logical AND of the signal received at the clock/mode 0 input 902 and the reset signal received at the reset input 912. Similarly, when the digital control interface 800 is configured as a GPIO interface, the multiplexor 924 outputs the logical AND of the signal received at the data/mode 1 input 904 and the reset signal received at the reset input 912. The logical ANDs may be obtained by the AND gates 926 and 928. However, other logical equivalents are possible, such as by using a NAND gate and an inverter. As previously described with respect to FIG. 7, the use of the AND gates 926 and 928 may reduce or eliminate digital noise.

Each of the multiplexors may be controlled by the reset signal received from the reset input 912. In other words, the select signal provided to the multiplexors may be the reset signal. As described above, the reset signal may be received from the power on reset 610 and, in some cases, may be an inverted version of a signal received from the VIO pin 604. When the reset signal is a logic '1', the digital control interface 800 is configured as a GPIO interface, and the multiplexor outputs the signals as described above for GPIO interface mode. When the reset signal is a logic '0', the digital control interface 800 is configured as a serial interface, and the multiplexor outputs the GPIO signals as described above for serial interface mode.

As previously described, the digital control interface 800, using the combinational logic 808 can provide three different modes to the power amplifier controller 506 and/or the power amplifier 504 by using the values of the mode 0 pin 802 and the mode 1 pin 804 to determine whether to output an enable signal instead or dedicating a separate pin to an enable control signal. When one of the three configured modes is selected, the combinational logic block 808 is configured to output an enable signal. When the fourth mode is selected, the combinational logic block 808 is configured to output a not enabled signal. Table 1 illustrates one non-limiting example for the outputs of the combinational logic block 808 to the level shifters based on the value of the mode pins when the digital control interface 800 is configured as a GPIO interface. The mode setting of Table 1 corresponds to the setting of the power amplifier controller 506 based on the output of the mode 0 and mode 1 signals to the mode 0 and mode 1 level shifters 810 and 812 respectively.

TABLE 1

| MODE 0 | MODE 1 | ENABLE | MODE SETTING |
|---|---|---|---|
| 0 | 0 | NO | — |
| 0 | 1 | YES | 1 |
| 1 | 0 | YES | 2 |
| 1 | 1 | YES | 3 |

In some embodiments, the digital control interface 800 can perform a modified version of the process 400. For example, in some cases, the block 428 can include providing a first and second mode signal from a serial interface core to the first mode level shifter 810 and the second mode level shifter 812, respectively. Further, the block 418, in some cases, includes providing a first mode signal from the clock/mode pin 802 to the first mode level shifter 810 and a second mode signal from the data/mode pin 804 to the second mode level shifter 812. In certain embodiments, by providing two mode signals, the digital control interface 800 can provide three modes when operating as a GPIO interface instead of two.

In some embodiments, the operation of the block 420 may be modified to provide the first mode signal and the second mode signal from the clock/mode pin 802 and the data/mode pin 804, respectively, to the combinational logic block 808. The combinational logic block 808 can then determine whether to provide an enable signal to the enable level shifter 616 based on the first and second mode signal thereby enabling the digital control interface 800 to output an enable signal to the power amplifier controller 506 without having a dedicated enable pin. Advantageously, in certain cases, by eliminating the need for an enable pin, the digital control interface can support more modes for configuring a power amplifier by repurposing the enable pin as a second mode pin.

Additional Embodiments

In some embodiments, a digital control interface includes a voltage input/output (VIO) pin configured to receive a VIO signal. Further, the digital control interface can include a front end core configured to provide a serial interface. The front end core may be in an active state when the VIO signal satisfies a first logic level and in an inactive state when the VIO signal satisfies a second logic level. Further, the digital control interface may be configured to provide a general purpose input/output (GPIO) interface when the front end core is set to the inactive state. In addition, the digital control interface can include a combinational logic block configured to provide an enable signal to an enable level shifter and a mode signal to a mode level shifter. Moreover, the digital control interface can include a clock/mode pin and a data/enable pin. The clock/mode pin may be configured to provide a clock signal to the front end core when the front end core is set to an active state and a mode signal to the combinational logic block when the front end core is set to an inactive state. The data/enable pin may be configured to provide a data signal to the front end core when the front end core is set to an active state and an enable signal to the combinational logic block when the front end core is set to an inactive state. Further, the digital control interface may include a power on reset configured to select, based on the VIO signal, a source of the enable signal and the mode signal provided to the enable level shifter and the mode level shifter respectively. With some implementations, the front end core includes a radio frequency front end (RFFE) core.

In some cases, the data/enable pin is further configured to provide an address signal to the front end core when the front end core is set to an active state, the address signal associated with a register of the front end core.

The digital control interface, in some implementations, may include a plurality of register level shifters. Each register level shifter of the plurality of register level shifters may be configured to receive a register signal from the front end core and to output the register signal thereby enabling a power amplifier to be configured based on the register signal, the register signal associated with a value stored in one of a plurality of registers associated with the front end core. In some cases, at least one register level shifter is further configured to receive a default signal during a reset state. Further, the power on reset block may be further configured to place the at least one register level shifter into the reset state. In some cases, the power on reset block can be further configured to provide a delayed reset signal to the front end core.

In certain embodiments, the digital control interface includes a first buffer and a second buffer. The first buffer may be connected between the data/enable pin and an output port of the front end core and the second buffer may be connected between the data/enable pin and an input port of the front end core. Further, the first buffer may be configured to enable data to be read from the front end core and the second buffer may be configured to enable data to be provided to the front end core. Both the first buffer and the second buffer may be tri-state buffers. In some designs, the connection between the first buffer and the data/enable pin, and the connection between the second buffer and the data/enable pin is a shared path. The first buffer and the second buffer may be further configured to prevent simultaneous data flow through the first buffer and the second buffer.

Some embodiments of the present disclosure may be configured to implement a method for providing multiple control interfaces in a digital control interface that includes a front end core and a combinational logic block. The method can include receiving a VIO signal at a VIO input to the digital control interface and determining whether the VIO signal is logic high. In response to determining that the VIO signal is logic high, the method can include configuring the digital control interface to function as a serial interface by providing a clock signal from a clock input to the front end core, providing a data signal from a data input to the front end core, and selecting, at the combinational logic block, a first enable signal and a first mode signal to output to an enable level shifter and a mode level shifter. Both the first enable signal and the first mode signal may be received from the front end core. In response to determining that the VIO signal is logic low, the method may include configuring the digital control interface to function as a general purpose input/output (GPIO) interface by providing a second enable signal from an enable input to the combinational logic block, providing a second mode signal from a mode input to the combinational logic block, and selecting, at the combinational logic block, the second enable signal and the second mode signal to output to the enable level shifter and the mode level shifter.

In some implementations, the method may include reconfiguring the front end core from a reset state to an active state in response to determining that the VIO signal is logic high. Reconfiguring the front end core from the reset state to the active state can include configuring a set of internal registers of the front end core to a default value. With some implementations of the method, at least one register from the set of internal registers is configured to a different default value than at least one other register from the set of internal registers.

Further, the method can include providing an output of the enable level shifter and an output of the mode level shifter to a power amplifier controller thereby enabling the power amplifier controller to configure a power amplifier based on the output of the enable level shifter and the output of the mode level shifter. In addition, the method may include placing the front end core into a reset mode in response to determining that the VIO signal is logic low. Placing the front end core into the reset mode may include maintaining a default value at a set of register level shifters.

Certain aspects of the present disclosure can be included as part of a power amplifier. The power amplifier can include a digital control interface and a mode selector configured to provide a VIO signal to the digital control interface. The VIO signal may be configured to set a mode of the digital control interface. In certain implementations, the digital control interface includes a voltage input/output (VIO) pin configured to receive the VIO signal and a front end core configured to provide a serial interface. The front end core may be in an active state when the VIO signal satisfies a first logic level and in an inactive state when the VIO signal satisfies a second logic level. The digital control interface can be configured to provide a general purpose input/output (GPIO) interface when the front end core is set to the inactive state. Further, the digital control interface can include a combinational logic block configured to provide an enable signal to an enable level shifter and a mode signal to a mode level shifter and a clock/mode pin configured to provide a clock signal to the front end core when the front end core is set to an active state and a mode signal to the combinational logic block when the front end core is set to an inactive state. Moreover, the digital control interface may include a data/enable pin configured to provide a data signal to the front end core when the front end core is set to an active state and an enable signal to the combinational logic block when the front end core is set to an inactive state. In some cases, the digital control interface includes a power on reset block configured to select, based on the VIO signal, a source of the enable signal and the mode signal provided to the enable level shifter and the mode level shifter respectively. In some implementations, the power amplifier control module also includes a power amplifier and a power amplifier controller configured to receive the enable signal from the enable level shifter and the mode signal from the mode level shifter, and to provide a control signal to the power amplifier based on the mode signal. The control signal may specify a mode of operation of the power amplifier.

In some implementations of the power amplifier module, the data/enable pin is further configured to provide an address signal to the front end core when the front end core is set to an active state. The address signal can be associated with a register of the front end core. Further, in some cases, the digital control interface includes a plurality of register level shifters. Each register level shifter of the plurality of register level shifters may be configured to receive a register signal from the front end core and to output the register signal thereby enabling a power amplifier to be configured based on the register signal. The register signal may be associated with a value stored in one of a plurality of registers associated with the front end core. Further, in some cases, at least one register level shifter is further configured to receive a default signal during a reset state. The power on reset block may be configured to place the at least one register level shifter into the reset state.

In some embodiments, a digital control interface includes a voltage input/output (VIO) pin configured to receive a VIO signal. The VIO signal may correspond to one of a first logic level and a second logic level. Further, the digital control interface may include a clock/mode pin configured to receive a first signal corresponding to one of the first logic level and the second logic level, and a data/mode pin configured to receive a second signal corresponding to one of the first logic level and the second logic level. In addition, the digital control interface may include a general purpose input/output (GPIO) interface module and a serial interface module. In some cases, the GPIO interface module includes an enable level shifter, a first mode level shifter, a second mode level shifter, and a combinational logic block. The combinational logic block can be configured to provide an enable signal to the enable level shifter for output to a power amplifier controller. Further, the combinational logic block can be configured to provide a first mode signal to the first mode level shifter for output to the power amplifier controller and a second mode signal to the second mode level shifter for output to the power amplifier controller. The enable signal may correspond to an enable logic value when one or more of the first signal and the second signal correspond to the first logic level and the VIO signal corresponds to the second logic level. Moreover, the first mode signal may correspond to the first signal and the second mode signal may correspond to the second signal when the VIO signal corresponds to the second logic level. In some cases, the power amplifier controller is configured to control a power amplifier based, at least in part, on the first mode signal and the second mode signal. Some implementations of the serial interface module include a serial interface core and a reset logic block. The serial interface core can be configured to provide a serial interface when the VIO signal corresponds to the first logic level and the reset logic block can be configured to place the serial interface core into a reset mode when the VIO signal corresponds to the second logic level.

In some embodiments, the enable signal corresponds to a non-enabled logic value when the first signal and the second signal each correspond to the second logic level and the VIO signal corresponds to the second logic level. Further, the enable signal may correspond to a serial enable value received from the serial interface core when the VIO signal corresponds to the first logic value. In addition, the first mode signal may correspond to a first serial mode signal received from the serial interface core when the VIO signal corresponds to the first logic value and the second mode signal may correspond to a second serial mode signal received from the serial interface core when the VIO signal corresponds to the first logic value.

With some implementations, the data/mode pin is further configured to provide an address signal to the serial interface core when the VIO signal corresponds to the first logic level. The address signal may be associated with a register of the serial interface core. In addition, the clock/mode pin may be further configured to provide a clock signal to the serial interface core when the VIO signal corresponds to the first logic level.

The digital control interface, in some embodiments, includes a plurality of register level shifters. Each register level shifter of the plurality of register level shifters may be configured to receive a register signal from the serial interface core and to output the register signal to the power amplifier controller. This enables, in some cases, the power amplifier controller to configure the power amplifier based on the register signal. The register signal can be associated with a value stored in one of a plurality of registers associated with the serial interface core.

In some embodiments, the serial interface module further includes a first buffer and a second buffer. The first buffer can be configured to enable data to be read from the serial interface core and the second buffer configured to prevent data from being written to the serial interface core when a buffer control signal is set to a first value. Further, the first buffer can be configured to prevent data from being read from the serial interface core and the second buffer configured to enable data to be written to the serial interface core when the buffer control signal is set to a second value. In some cases, the buffer control signal is generated by the serial interface core.

Some embodiments of the present disclosure may be configured to implement a method for providing multiple control interfaces in a digital control interface that includes a GPIO interface module and a serial interface module, which may include a serial interface core. The method can include receiving a VIO signal at a VIO input to the digital control interface and determining whether the VIO signal corresponds to a logic high value. In response to determining that the VIO signal corresponds to the logic high value, the method can include configuring the digital control interface to function as a serial interface by providing a clock signal from a clock input to the serial interface core, providing a data signal from a data input to the serial interface core, and selecting, at a combinational logic block, a first enable signal to output to an enable level shifter, a first mode signal to output to a first mode level shifter, and a second mode signal to output to a second mode level shifter. The first enable signal, the first mode signal, and the second mode signal may each be received from a serial interface core. In response to determining that the VIO signal corresponds to a logic low value, the method may include configuring the digital control interface to function as a general purpose input/output (GPIO) interface by providing a first input signal and a second input signal to the combinational logic block, and selecting, at the combinational logic block, a second enable signal to output to the enable level shifter, a third mode signal to output to the first mode level shifter, and a fourth mode signal to output to the second mode level shifter. The second enable signal may be based on a logical operation of the first input signal and the second input signal. Further, the third mode signal may be based, at least in part, on the first input signal, and the fourth mode signal may be based, at least in part, on the second input signal.

The method, in some cases, includes reconfiguring the serial interface core from a reset state to an active state in response to determining that the VIO signal corresponds to the logic high value. Reconfiguring the serial interface core from the reset state to the active state can include configuring a set of internal registers of the serial interface core to a default value.

Further, the method can include providing an output of the enable level shifter, an output of the first mode level shifter, and an output of the second mode level shifter to a power amplifier controller thereby enabling the power amplifier controller to configure a power amplifier based on the output of the first model level shifter and the output of the second mode level shifter when the output of the enable level shifter corresponds to an enabled value. Moreover, the method may include placing the serial interface core into a reset mode in response to determining that the VIO signal corresponds to the logic low value. Placing the serial interface core into the reset mode may include loading a set of default values into a set of registers of the serial interface core.

Certain aspects of the present disclosure can be included as part of a power amplifier. The power amplifier can include a digital control interface, a power amplifier, a power amplifier controller, and a mode selector configured to provide a VIO signal to the digital control interface. In some cases, the VIO signal is configured to set the mode of a digital control interface and may corresponding to one of a first logic level and a second logic level. The digital control interface may include a voltage input/output (VIO) pin configured to receive the VIO signal, a clock/mode pin configured to receive a first signal corresponding to one of the first logic level and the second logic level, and a data/mode pin configured to receive a second signal corresponding to one of the first logic level and the second logic level. Further, the digital control interface may include a general purpose input/output (GPIO) interface module, which may include an enable level shifter, a first mode level shifter, a second mode level shifter, and a combinational logic block. In some cases, the combinational logic block is configured to provide an enable signal to the enable level shifter for output to the power amplifier controller. The combinational logic block may be further configured to provide a first mode signal to the first mode level shifter for output to the power amplifier controller and a second mode signal to the second mode level shifter for output to the power amplifier controller. The enable signal can correspond to an enable logic value when one or more of the first signal and the second signal correspond to a first logic level and the VIO signal corresponds to the second logic level. In some cases, the first mode signal corresponds to the first signal and the second mode signal corresponds to the second signal when the VIO signal corresponds to the second logic level. In addition, the digital control interface can include a serial interface module, which may include a serial interface core and a reset logic block. The serial interface core can be configured to provide a serial interface when the VIO signal corresponds to the first logic level and the reset logic block can be configured to place the serial interface core into a reset mode when the VIO signal corresponds to the second logic level. Further, the power amplifier controller can be configured to receive the enable signal from the enable level shifter, the first mode signal from the first mode level shifter, and the second mode signal from the second mode level shifter. In addition, the power amplifier controller can control the power amplifier by providing a control signal to the power amplifier based, at least in part, on the first mode signal and the second mode signal. This control signal may specify a mode of operation of the power amplifier.

In some embodiments, a wireless device may include a power amplifier module. The power amplifier module may include one or more of the previously described embodiments. Further, the wireless device can include a power supply configured to power the power amplifier module and a transceiver configured to provide a control signal to a mode selector of the power amplifier module.

In some embodiments, a digital control interface includes a voltage input/output (VIO) pin configured to receive a VIO signal. Further, the digital control interface may include a general purpose input/output (GPIO) interface module and a serial interface module. The GPIO interface module can include an enable level shifter, a first mode level shifter, a second mode level shifter, and a combinational logic block. The combinational logic block may be configured to provide an enable signal to the enable level shifter for output to a power amplifier controller. The combinational logic block may further be configured to provide a first mode signal to the first mode level shifter for output to the power amplifier controller and a second mode signal to the second mode level shifter for output to the power amplifier controller. The serial interface module can include a serial interface core and a reset logic block. The serial interface core can be configured to provide a serial interface when the VIO signal corresponds to a first logic level. Further, the reset logic block can be configured to place the serial interface core into a reset mode when the VIO signal corresponds to a second logic level. Moreover, the GPIO interface module can be configured to provide a GPIO interface when the VIO signal corresponds to the second logic level.

In certain implementations, the digital control interface may also include a clock/mode pin configured to receive a first signal corresponding to one of the first logic level and the second logic level. Further, the digital control interface may include a data/mode pin configured to receive a second signal corresponding to one of the first logic level and the second logic level. In some cases, the enable signal may correspond to an enable logic value when one or more of the first signal and the second signal correspond to the first logic level and the VIO signal corresponds to the second logic level. In addition, the first mode signal may correspond to the first signal and the second mode signal may correspond to the second signal when the VIO signal corresponds to the second logic level. In some embodiments, the power amplifier controller is configured to control a power amplifier based, at least in part, on the first mode signal and the second mode signal.

Terminology

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The term "coupled" is used to refer to the connection between two elements, the term refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A digital control interface comprising:
   a first interface device configured to provide a serial interface when active; and
   a second interface device configured to provide a general purpose input/output interface when active, the first interface device inactive when the second interface device is active, the second interface device activated in response to a control signal corresponding to a first logic value, the second interface device including combinational logic configured to provide one or more input signals to the digital control interface to one or more level shifters when the control signal corresponds to the first logic value.

2. The digital control interface of claim 1 further comprising a control circuit that deactivates the first interface device in response to the control signal corresponding to the first logic value.

3. The digital control interface of claim 1 further comprising a control circuit that configures a register of the first interface device with a default signal value during activation of the first interface device.

4. The digital control interface of claim 1 wherein the activation of the first interface device is triggered by the control signal corresponding to a second logic value.

5. A digital control interface comprising:
   a first interface device configured to provide a serial interface when active;
   a second interface device configured to provide a general purpose input/output interface when active, the first interface device inactive when the second interface device is active, the second interface device activated in response to a control signal corresponding to a first logic value; and
   a tri-state buffer, the tri-state buffer set to a first state when reading data from the first interface device and set to a second state when writing data to the first interface device.

6. The digital control interface of claim 5 wherein the digital control interface further includes a second tri-state buffer, the second tri-state buffer set to the first state when writing data from the first interface device and set to the second state when reading data from the first interface device.

7. A digital control interface comprising:
   a front end core configured to provide a serial interface, the front end core in an active state when a configuration signal satisfies a first logic level and in an inactive state when the configuration signal does not satisfy the first logic level, the digital control interface configured to provide a general purpose input/output interface when the front end core is set to the inactive state; and
   a combinational logic block configured to output a first enable signal and a first mode signal received from the front end core when the front end code is in an active state and to output a second enable signal and a second mode signal received from a pair of input pins when the front end code is in an inactive state.

8. The digital control interface of claim 7 wherein the digital control interface further includes a tri-state buffer, the tri-state buffer set to a first state when reading data from the front end core and set to a second state when writing data to the front end core.

9. The digital control interface of claim 8 wherein the digital control interface further includes a second tri-state buffer, the second tri-state buffer set to the first state when writing data from the front end core and set to the second state when reading data from the front end core.

10. The digital control interface of claim 8 further comprising a first set of level shifters configured to adjust a voltage level of one or more signals received from the front end core.

11. The digital control interface of claim 10 wherein the first set of level shifters are configured with a default state when the configuration signal does not satisfy the first logic level.

12. The digital control interface of claim 10 further comprising a second set of level shifters configured to adjust a voltage level of one or more signals received from the combinational logic block.

13. A power amplifier system comprising:
   a power amplifier; and
   an interface die that interfaces between the power amplifier and a signal source, the interface die configurable to provide a plurality of heterogeneous interfaces, the plurality of heterogeneous interfaces sharing at least a portion of hardware of the interface die, the interface die including a serial interface component that provides a serial interface when the interface die receives a mode selection signal of a first value, and the interface die including a general purpose input/output interface component that provides a general purpose input/output interface when the mode selection signal is of a second value.

14. The power amplifier system of claim 13 wherein the signal source provides the mode selection signal to the interface die.

15. The power amplifier system of claim 13 wherein the signal source is a transceiver.

16. The power amplifier system of claim 13 wherein the signal source is a mode selection device that determines a value of the mode selection signal based at least in part on an antenna signal.

17. The power amplifier system of claim 13 wherein the interface die further includes a control circuit that deactivates the serial interface component in response to a deactivation voltage signal and that configures a register of the serial interface component with a default signal value during activation of the serial interface component.

18. The power amplifier system of claim 13 wherein the general purpose input/output interface component includes combinational logic configured to provide general purpose input/output pin inputs to one or more level shifters when the mode selection signal is of the second value.

19. The power amplifier system of claim 13 wherein the interface die further includes a first tri-state buffer and a second tri-state buffer, the first tri-state buffer set to a first state when reading data from the serial interface component and set to a second state when writing data to the serial interface component, the second tri-state buffer set to the first state when writing data from the serial interface component and set to the second state when reading data from the serial interface component.

* * * * *